United States Patent [19]

Meyer et al.

[11] Patent Number: 5,515,855
[45] Date of Patent: May 14, 1996

[54] DOME-SHAPED RESONATOR FOR NUCLEAR MAGNETIC RESONANCE IMAGING AND SPECTROSCOPY

[75] Inventors: Kristen L. Meyer, New York, N.Y.; Douglas Ballon, Gillette, N.J.

[73] Assignee: Sloan-Kettering Institute for Cancer Research, New York, N.Y.

[21] Appl. No.: 286,683

[22] Filed: Aug. 5, 1994

[51] Int. Cl.$^6$ .................................................. A61B 5/055
[52] U.S. Cl. ...................... 128/653.5; 324/318; 324/322; 333/227
[58] Field of Search .................. 128/653.2, 653.5; 324/309, 307, 318, 322; 333/219, 227, 231, 235

[56] References Cited

U.S. PATENT DOCUMENTS

| | | | |
|---|---|---|---|
| 4,634,980 | 1/1987 | Misic et al. | 324/322 |
| 4,641,097 | 2/1987 | Bottomley et al. | 324/318 |
| 4,694,255 | 9/1987 | Hayes | 324/322 |
| 4,916,418 | 4/1990 | Rath | 324/322 |
| 4,947,121 | 8/1990 | Hayes | 324/322 |
| 5,050,605 | 9/1991 | Eydelman et al. | 128/653.5 |
| 5,196,797 | 3/1993 | Tropp | 324/322 |
| 5,315,251 | 5/1994 | Derby | 324/318 |
| 5,372,137 | 12/1994 | Wong et al. | 128/653.5 |
| 5,379,767 | 1/1995 | Derby et al. | 128/653.5 |

OTHER PUBLICATIONS

An Efficient, Highly Homogeneous Radiofrequency Coil for Whole–Body NMR Imaging at 1.5T; Cecil E. Hayes et al.; Journal of Magetic Resonance 63,622–628 (1985).

A Quadrature Transmit–Receive Endcapped Birdcage Coil for Imaging of the Human Head at 125 MHz; Wong et al.; Society of Magnetic Resonance in Medicine, 12th Annual Scientific Meeting, New York, N.Y. Aug. 14–20, 1993.

An Endcap Birdcage Resonator for Quadrature Head Imaging; Cecil E. Hayes, Proceedings of the Society of Magnetic Resonance in Medicine, 5th Annual Meeting, 1986, Montreal, Works in Progress, p. 39.

Primary Examiner—Krista M. Zele
Attorney, Agent, or Firm—John P. White

[57] ABSTRACT

A radiofrequency resonator for nuclear magnetic resonance imaging and spectroscopy of the human head in which the geometry of the resonator comprises a single end ring connected to a plurality of legs which extend along a cylinder and which are joined in pairs on a hemispherical dome.

21 Claims, 18 Drawing Sheets

FIGURE 7

Planar 3x3 Resonator          3x3 Dome Resonator

141 MHz ▬▬ (2,2)*

120 MHz ▬▬ (2,2)

105 MHz ≡≡ (2,1) (1,2)

98.5 MHz ▬▬
95 MHz ▬▬ (2,0) (0,2)

83 MHz ≡≡ (2,1) (1,2)
82 MHz ▬▬ (1,1)               79 MHz ≡≡ (2,0) (0,2)

71 MHz ▬▬ (1,1)

64 MHz ≡≡ (1,0) (0,1)         63 MHz ≡≡ (1,0) (0,1)

DOME-SHAPED RESONATOR FOR NUCLEAR MAGNETIC RESONANCE IMAGING AND SPECTROSCOPY

BACKGROUND OF THE INVENTION

The present invention relates to a radiofrequency resonator for nuclear magnetic resonance imaging and spectroscopy of the human head, whose geometry consists of a single end-ring connected to a plurality of legs which extend along a cylinder and are joined in pairs on a hemispherical dome.

Within this application several publications are referenced by arabic numerals within parentheses. Full citations for these and other references may be found at the end of the specification immediately preceding the claims. The disclosures of all of these publications in their entireties are hereby incorporated by reference into this application in order to more fully describe the state of the art to which this invention pertains.

For the resonator described above the most homogeneous normal mode of this structure is doubly degenerate and affords quadrature operation. The high sensitivity in the hemispherical end is particularly suited to human brain studies. This resonator represents a clinical application of two-dimensional ladder network resonant structures whose operation may be understood by analogy to the mechanical problem of oscillating two-dimensional membranes.

Straightforward analysis of the resonant behavior of LC ladder networks may be accomplished by solving the eigenvalue problem defined by the Kirchoff mesh equations. The low-pass birdcage resonator (1) has been completely characterized using this technique (2,3). In some cases, an analogy to one-dimensional mechanical coupled mass-spring systems, where the mesh current amplitudes are analogous to the displacements of the masses, provides a more intuitive understanding of these networks (2). For example, the low-pass birdcage resonator is analogous to a one-dimensional coupled mass-spring system with periodic boundary conditions. The amplitudes of the resulting mesh currents vary sinusoidally with the mesh index and integral numbers of wavelengths are allowed (2). Similarly, a nine-leg half-birdcage resonator (4) has been shown to correspond to a coupled mass-spring system with fixed end conditions which result in sinusoidal distributions of mesh current amplitudes with half-integral multiples of the wavelength allowed.

Recently, the electro-mechanical analogy has been extended to finite length, two-dimensional LC ladder networks (5). Specifically, the correspondence between a 2D ladder network resonator and a mechanical vibrating membrane was exploited (6). By assuming independent resonant operation in each spatial dimension and applying appropriate boundary conditions, the resonant mode structures of square-mesh, planar 2D ladder networks were predicted (5).

SUMMARY OF THE INVENTION

It is an object of the present invention to provide a cylindrical volume resonator.

It is a further object of the present invention to provide a cylindrical volume resonator exhibiting degenerate modes for quadrature operation and a $B_1$ sensitivity profile which is especially suited for nuclear magnetic resonance studies of the human head.

According to one aspect of the present invention, a radiofrequency resonator for nuclear magnetic resonance imaging and spectroscopy of a patient is provided, comprising a hollow cylindrical support structure with an outer surface, an inner diameter, an open end, and a dome-shaped closed end, an end ring conductor attached to the outer surface of the hollow cylindrical support structure adjacent the open end, eight substantially equal length leg conductors with respective first ends, second ends, and midpoints, each of the respective first ends being electrically joined to the end ring conductor at positions spaced substantially 45 degrees apart from one another, each of the eight leg conductors being attached to the outer surface of the hollow cylindrical support structure and each respective second end of the eight leg conductors terminating adjacent the dome-shaped closed end, and four dome conductors attached to the outer surface of the dome-shaped closed end, each of the four dome conductors having respective midpoints and two endpoints, an endpoint of each dome conductor being electrically joined to respective second ends of pairs of leg conductors spaced 135/225 degrees apart from one another, whereby each dome conductor is connected to two of said leg conductors and whereby each leg conductor is connected to one dome conductor, wherein each of said four dome conductors intersects two of said four dome conductors at two intersection points and wherein each of said four dome conductors that intersect each of said two dome conductors are electrically joined to said two intersecting dome conductors at said intersection points.

According to another aspect of the present invention, a radiofrequency resonator for nuclear magnetic resonance imaging and spectroscopy of a patient is provided, comprising an end ring conductor with a central axis, eight substantially equal length leg conductors with respective first ends, second ends, and midpoints, each of the respective first ends being electrically joined to the end ring conductor at positions spaced substantially 45 degrees apart from one another, each of the eight leg conductors being substantially parallel with the central axis and each of the respective second ends of the eight leg conductors terminating on the same side of the end ring conductor, and four dome conductors having respective midpoints and two endpoints, an endpoint of each dome conductor being electrically joined to respective second ends of pairs of leg conductors spaced 135/225 degrees apart from one another, whereby each dome conductor is connected to two of said leg conductors and whereby each leg conductor is connected to one dome conductor, wherein each midpoint of each dome conductor is a respective predetermined distance from the end ring conductor, said predetermined distances being greater than a distance between the first and second ends of the leg conductors, whereby the dome conductors form a dome shape, each of said four dome conductors intersecting two of said four dome conductors at two intersection points and each of said four dome conductors that intersect each of said two dome conductors being electrically joined to said two intersecting dome conductors at said intersection points.

According to another aspect of the present invention, a radiofrequency resonator for nuclear magnetic resonance imaging and spectroscopy of a patient is provided, comprising a hollow cylindrical support structure with an outer surface, an inner diameter, an open end, and a dome-shaped closed end, an end ring conductor attached to the outer surface of the hollow cylindrical support structure adjacent the open end, sixteen substantially equal length leg conductors with respective first ends, second ends, and midpoints, each of the respective first ends being electrically joined to the end ring conductor at positions spaced substantially 22.5 degrees apart from one another, each of the sixteen leg conductors being attached to the outer surface of the hollow cylindrical support structure and each respective second end of the sixteen leg conductors terminating adjacent the dome-shaped closed end, and eight dome conductors attached to the outer surface of the dome-shaped closed end, each of the eight dome conductors having respective midpoints and two endpoints, an endpoint of each dome conductor being electrically joined to respective second ends of pairs of leg conductors spaced 112.5/247.5 degrees apart from one another, whereby each dome conductor is connected to two of said leg conductors and whereby each leg conductor is connected to one dome conductor, wherein each of said eight dome conductors intersects four of said eight dome conductors at four intersection points and wherein each of said eight dome conductors that intersect each of said four dome conductors are electrically joined to said four intersecting dome conductors at said intersection points.

According to another aspect of the present invention, a radiofrequency resonator for nuclear magnetic resonance imaging and spectroscopy of a patient is provided, comprising: an end ring conductor with a central axis, sixteen substantially equal length leg conductors with respective first ends, second ends, and midpoints, each of the respective first ends being electrically joined to the end ring conductor at positions spaced substantially 22.5 degrees apart from one another, each of the sixteen leg conductors being substantially parallel with the central axis and each of the respective second ends of the sixteen leg conductors terminating on the same side of the end ring conductor, and eight dome conductors having respective midpoints and two endpoints, an endpoint of each dome conductor being electrically joined to respective second ends of pairs of leg conductors spaced 112.5/247.5 degrees apart from one another, whereby each dome conductor is connected to two of said leg conductors and whereby each leg conductor is connected to one dome conductor, wherein each midpoint of each dome conductor is a respective predetermined distance from the end ring conductor, said predetermined distances being greater than a distance between the first and second ends of the leg conductors, whereby the dome conductors form a dome shape, each of said eight dome conductors intersecting four of said eight dome conductors at four intersection points and each of said eight dome conductors that intersect each of said four dome conductors being electrically joined to said four intersecting dome conductors at said intersection points.

According to another aspect of the present invention, a radiofrequency resonator for nuclear magnetic resonance imaging and spectroscopy of a patient is provided, comprising a hollow cylindrical support structure with an outer surface, an inner diameter, an open end, and a dome-shaped closed end, an end ring conductor attached to the outer surface of the hollow cylindrical support structure adjacent the open end, n*2 substantially equal length leg conductors with respective first ends, second ends, and midpoints, each of the respective first ends being electrically joined to the end ring conductor at positions spaced substantially 360/(n*2) degrees apart from one another, each of the n*2 leg conductors being attached to the outer surface of the hollow cylindrical support structure and each respective second end of the n*2 leg conductors terminating adjacent the dome-shaped closed end, and n dome conductors attached to the outer surface of the dome-shaped closed end, each of the n dome conductors having respective midpoints and two endpoints, an endpoint of each dome conductor being electrically joined to respective second ends of pairs of leg conductors spaced (360/(n*2))*((n/2)+1) degrees apart from one another in one circumferential direction and (360)−[(360/(n*2))*((n/2)+1)] degrees apart from one another in another circumferential direction, whereby each dome conductor is connected to two of said leg conductors and whereby each leg conductor is connected to one dome conductor, wherein each of said n dome conductors intersects n/2 of said n dome conductors at n/2 intersection points and wherein each of said n dome conductors that intersect each of said n/2 dome conductors are electrically joined to said n/2 intersecting dome conductors at said intersection points, and wherein n is an integer greater than 3.

These and other advantages will become apparent from the detailed description accompanying the claims and attached drawing figures.

DESCRIPTION OF THE DRAWINGS

FIG. 7 is a chart showing experimentally determined mode structures of the planar 3×3 mesh resonator and the 3×3 mesh dome resonator;

DETAILED DESCRIPTION OF THE PREFERRED EMBODIMENTS

Figure 1:
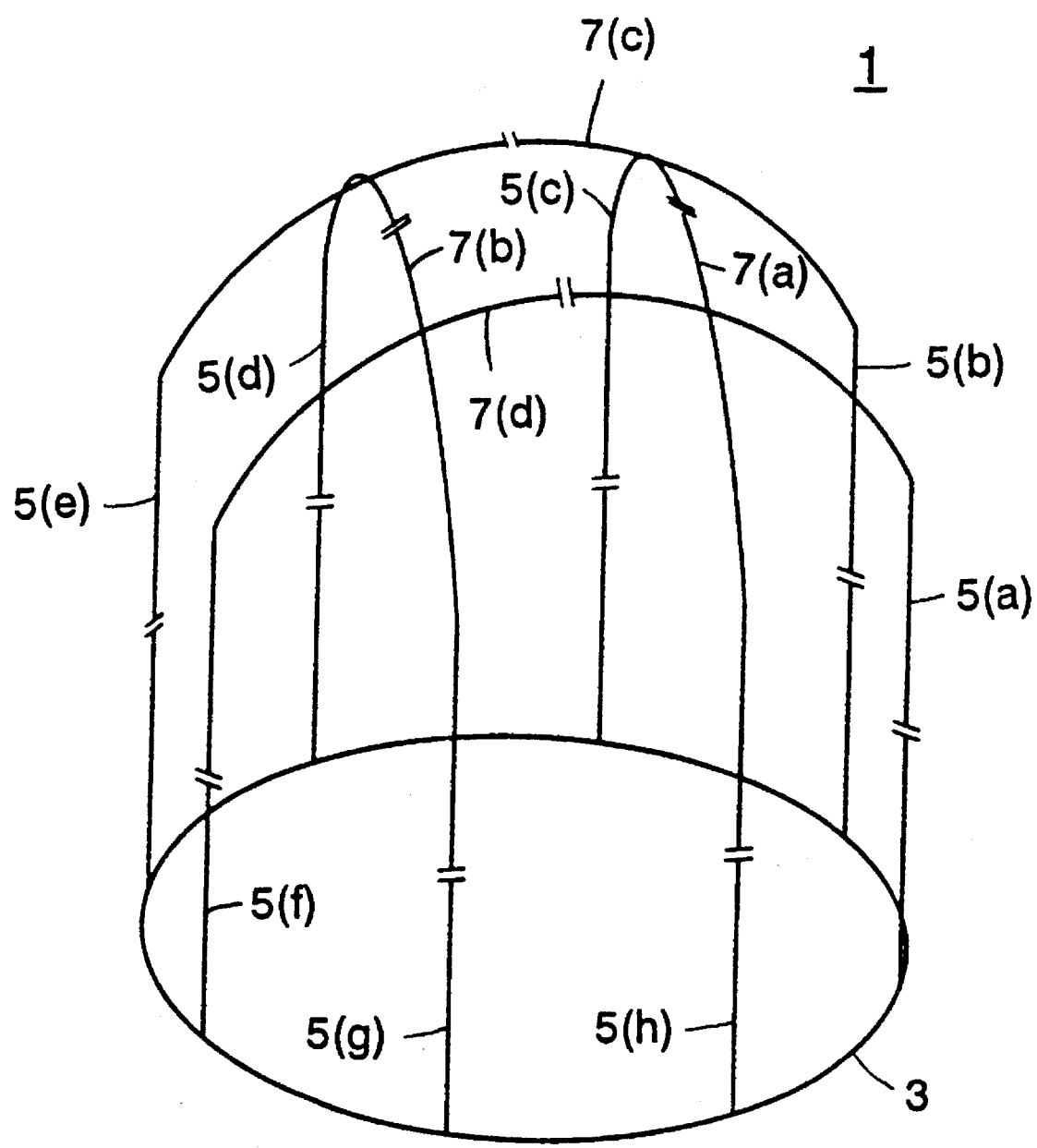
FIG. 1 is a schematic diagram of a 3×3 mesh dome resonator according to an embodiment of the present invention.

According to one aspect of the present invention, a radiofrequency resonator for nuclear magnetic resonance imaging and spectroscopy of a patient is provided, comprising a hollow cylindrical support structure with an outer surface, an inner diameter, an open end, and a dome-shaped closed end, an end ring conductor attached to the outer surface of the hollow cylindrical support structure adjacent the open end, eight substantially equal length leg conductors with respective first ends, second ends, and midpoints, each of the respective first ends being electrically joined to the end ring conductor at positions spaced substantially 45 degrees apart from one another, each of the eight leg conductors being attached to the outer surface of the hollow cylindrical support structure and each respective second end of the eight leg conductors terminating adjacent the dome-shaped closed end, and four dome conductors attached to the outer surface of the dome-shaped closed end, each of the four dome conductors having respective midpoints and two endpoints, an endpoint of each dome conductor being electrically joined to respective second ends of pairs of leg conductors spaced 135/225 degrees apart from one another, whereby each dome conductor is connected to two of said leg conductors and whereby each leg conductor is connected to one dome conductor, wherein each of said four dome conductors intersects two of said four dome conductors at two intersection points and wherein each of said four dome conductors that intersect each of said two dome conductors are electrically joined to said two intersecting dome conductors at said intersection points.

The radiofrequency resonator may further comprise four capacitors electrically bridging four respective gaps formed in said four dome conductors at respective ones of the midpoints of the four dome conductors and eight capacitors electrically bridging eight respective gaps formed in said eight leg conductors at respective ones of the midpoints of the eight leg conductors.

The capacitors may be 20.5 picofarad capacitors. The inner diameter of said hollow cylindrical support structure may be sized to permit the support structure to fit over the patient's head. The end ring conductor, the eight leg conductors, and the four dome conductors may be ½" copper tape. The inner diameter may be 27.9 cm and a length of the hollow cylindrical support structure with the dome-shaped end may be 27.9 cm.

According to another aspect of the present invention, a radiofrequency resonator for nuclear magnetic resonance imaging and spectroscopy of a patient is provided, comprising an end ring conductor with a central axis, eight substantially equal length leg conductors with respective first ends, second ends, and midpoints, each of the respective first ends being electrically joined to the end ring conductor at positions spaced substantially 45 degrees apart from one another, each of the eight leg conductors being substantially parallel with the central axis and each of the respective second ends of the eight leg conductors terminating on the same side of the end ring conductor, and four dome conductors having respective midpoints and two endpoints, an endpoint of each dome conductor being electrically joined to respective second ends of pairs of leg conductors spaced 135/225 degrees apart from one another, whereby each dome conductor is connected to two of said leg conductors and whereby each leg conductor is connected to one dome conductor, wherein each midpoint of each dome conductor is a respective predetermined distance from the end ring conductor, said predetermined distances being greater than a distance between the first and second ends of the leg conductors, whereby the dome conductors form a dome shape, each of said four dome conductors intersecting two of said four dome conductors at two intersection points and each of said four dome conductors that intersect each of said two dome conductors being electrically joined to said two intersecting dome conductors at said intersection points.

The radiofrequency resonator may further comprise four capacitors electrically bridging four respective gaps formed in said four dome conductors at respective ones of the midpoints of the four dome conductors, and eight capacitors electrically bridging eight respective gaps formed in said eight leg conductors at respective ones of the midpoints of the eight leg conductors.

The capacitors may be 20.5 picofarad capacitors. A diameter of the end ring conductor may be sized to allow the end ring conductor to fit over the patient's head.

According to another aspect of the present invention, a radiofrequency resonator for nuclear magnetic resonance imaging and spectroscopy of a patient is provided, comprising a hollow cylindrical support structure with an outer surface, an inner diameter, an open end, and a dome-shaped closed end, an end ring conductor attached to the outer surface of the hollow cylindrical support structure adjacent the open end, sixteen substantially equal length leg conductors with respective first ends, second ends, and midpoints, each of the respective first ends being electrically joined to the end ring conductor at positions spaced substantially 22.5 degrees apart from one another, each of the sixteen leg conductors being attached to the outer surface of the hollow cylindrical support structure and each respective second end of the sixteen leg conductors terminating adjacent the dome-shaped closed end, and eight dome conductors attached to the outer surface of the dome-shaped closed end, each of the eight dome conductors having respective midpoints and two endpoints, an endpoint of each dome conductor being electrically joined to respective second ends of pairs of leg conductors spaced 112.5/247.5 degrees apart from one another, whereby each dome conductor is connected to two of said leg conductors and whereby each leg conductor is connected to one dome conductor, wherein each of said eight dome conductors intersects four of said eight dome conductors at four intersection points and wherein each of said eight dome conductors that intersect each of said four dome conductors are electrically joined to said four intersecting dome conductors at said intersection points.

The radiofrequency resonator may further comprise twenty-four capacitors electrically bridging twenty-four respective gaps formed in said eight dome conductors at midpoints between said intersection points, and sixteen capacitors electrically bridging sixteen respective gaps formed in said sixteen leg conductors at respective ones of the midpoints of the sixteen leg conductors.

The capacitors may be 21.4 picofarad capacitors. The inner diameter of said hollow cylindrical support structure may be sized to permit the support structure to fit over the patient's head. The end ring conductor, the sixteen leg conductors, and the eight dome conductors may be ½" copper tape. The inner diameter may be 27.9 cm and a length of said hollow cylindrical support structure with the dome-shaped end may be 27.9 cm.

According to another aspect of the present invention, a radiofrequency resonator for nuclear magnetic resonance imaging and spectroscopy of a patient is provided, comprising: an end ring conductor with a central axis, sixteen substantially equal length leg conductors with respective first ends, second ends, and midpoints, each of the respective first ends being electrically joined to the end ring conductor at positions spaced substantially 22.5 degrees apart from one another, each of the sixteen leg conductors being substantially parallel with the central axis and each of the respective second ends of the sixteen leg conductors terminating on the same side of the end ring conductor, and eight dome conductors having respective midpoints and two endpoints, an endpoint of each dome conductor being electrically joined to respective second ends of pairs of leg conductors spaced 112.5/247.5 degrees apart from one another, whereby each dome conductor is connected to two of said leg conductors and whereby each leg conductor is connected to one dome conductor, wherein each midpoint of each dome conductor is a respective predetermined distance from the end ring conductor, said predetermined distances being greater than a distance between the first and second ends of the leg conductors, whereby the dome conductors form a dome shape, each of said eight dome conductors intersecting four of said eight dome conductors at four intersection points and each of said eight dome conductors that intersect each of said four dome conductors being electrically joined to said four intersecting dome conductors at said intersection points.

The radiofrequency resonator may further comprise twenty-four capacitors electrically bridging twenty-four respective gaps formed in said eight dome conductors at midpoints between said intersection points, and sixteen capacitors electrically bridging sixteen respective gaps formed in said sixteen leg conductors at respective ones of the midpoints of the sixteen leg conductors.

The capacitors may be 21.4 picofarad capacitors. A diameter of the end ring conductor may be sized to allow the end ring conductor to fit over the patient's head.

According to another aspect of the present invention, a radiofrequency resonator for nuclear magnetic resonance imaging and spectroscopy of a patient is provided, comprising a hollow cylindrical support structure with an outer surface, an inner diameter, an open end, and a dome-shaped closed end, an end ring conductor attached to the outer surface of the hollow cylindrical support structure adjacent the open end, n*2 substantially equal length leg conductors with respective first ends, second ends, and midpoints, each of the respective first ends being electrically joined to the end ring conductor at positions spaced substantially 360/(n*2) degrees apart from one another, each of the n*2 leg conductors being attached to the outer surface of the hollow cylindrical support structure and each respective second end of the n*2 leg conductors terminating adjacent the dome-shaped closed end, and n dome conductors attached to the outer surface of the dome-shaped closed end, each of the n dome conductors having respective midpoints and two endpoints, an endpoint of each dome conductor being electrically joined to respective second ends of pairs of leg conductors spaced (360/(n*2))*((n/2)+1) degrees apart from one another in one circumferential direction and (360)−[(360/(n*2))*((n/2)+1)] degrees apart from one another in another circumferential direction, whereby each dome conductor is connected to two of said leg conductors and whereby each leg conductor is connected to one dome conductor, wherein each of said n dome conductors intersects n/2 of said n dome conductors at n/2 intersection points and wherein each of said n dome conductors that intersect each of said n/2 dome conductors are electrically joined to said n/2 intersecting dome conductors at said intersection points, and wherein n is an integer greater than 3. It should be noted, however, that while the resonator does exhibit an increase in homogeneity as the number of legs, and thus the number of meshes in the matrix increases, the parasitic capacitance increases due to the closeness of the legs. A 3×3 mesh resonator according to one embodiment of the present invention is shown schematically in FIG. 1. The 3×3 mesh resonator 1 is comprised of a 3×3 matrix of meshes formed of end ring conductor 3, eight leg conductors 5(a)–5(h), and four dome conductors 7(a)–7(d). It is assumed that all coil segments have non-zero self-inductance. As is evident from FIG. 1, the structure is similar to that of an eight leg, low-pass birdcage except that one end-ring has been eliminated, and the legs have been routed across the end to form a dome-like geometry. The segments which intersect on the dome are electrically joined.

Figure 3:
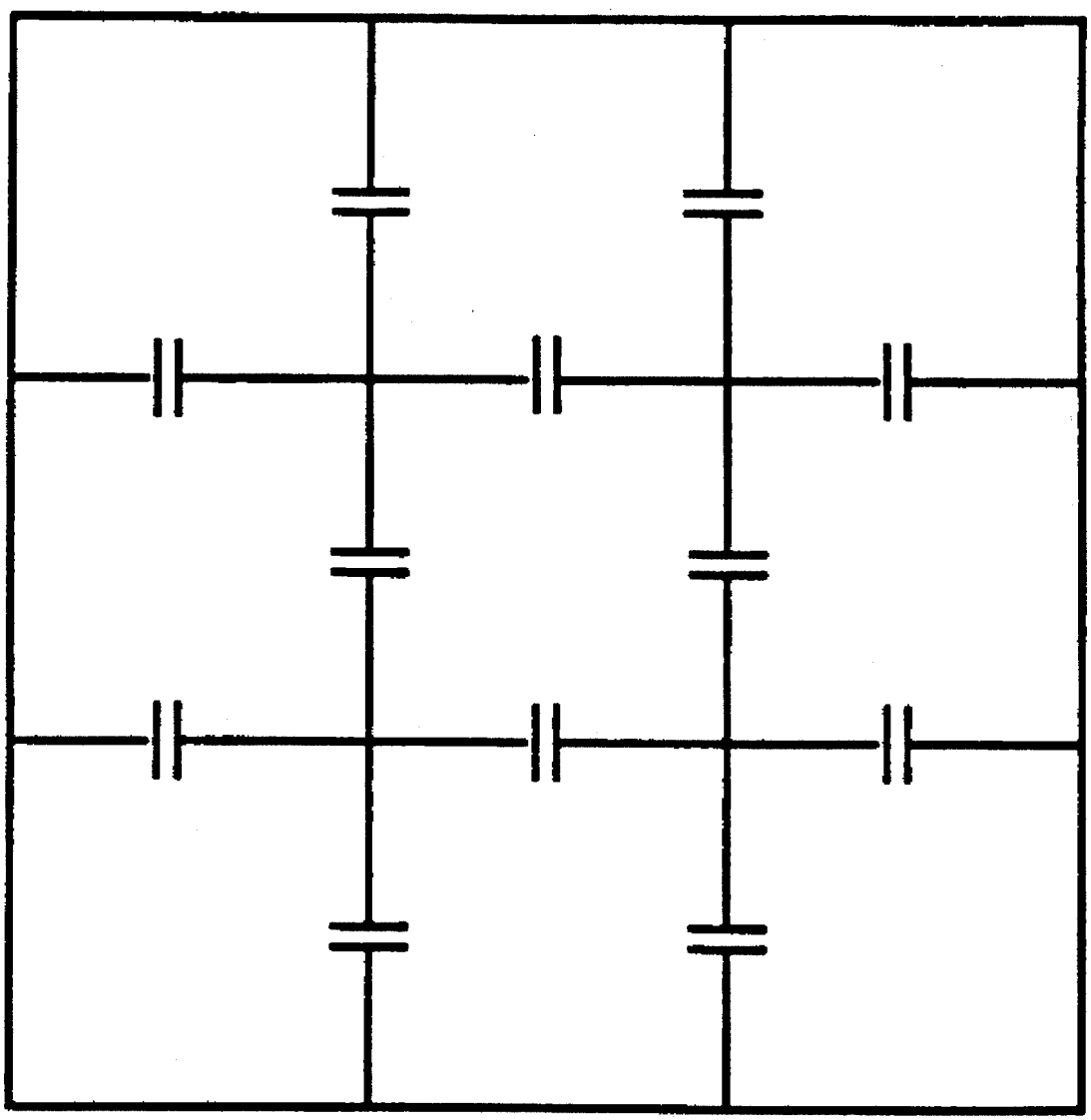
FIG. 3 is a diagram of a 3×3 square mesh planar resonator.

An understanding of the behavior of the dome resonator of the instant invention may be gained by examining the behavior of the planar, 3×3 square-mesh resonator shown schematically in FIG. 3. The planar resonator is topologically equivalent to the dome resonator, and its resonant modes have been described elsewhere (5). Briefly, a mesh current analysis yields equations with the same formal solutions as a vibrating membrane with free-edge boundary conditions (7). This free-edge condition gives rise to a cosinusoidal mesh current amplitude distribution in each dimension. The resultant mesh current amplitudes are given by:

$$I_{m,n} = A(\Omega,\Gamma)\cos\left[\frac{(m-1/2)\pi\Omega}{M}\right]\cos\left[\frac{(n-1/2)\pi\Gamma}{N}\right],$$

where m and n are the mesh indices, $\Omega$ and $\Gamma$ are the indices of the normal modes of oscillation, and M and N are the numbers of meshes in each dimension. The coefficient A is a function of the mode indices and also depends upon the coupling geometry of the resonator to a driving voltage. Any mode of the resonator may be specified by the mode index pair, $(\Omega,\Gamma)$.

Figure 4B:
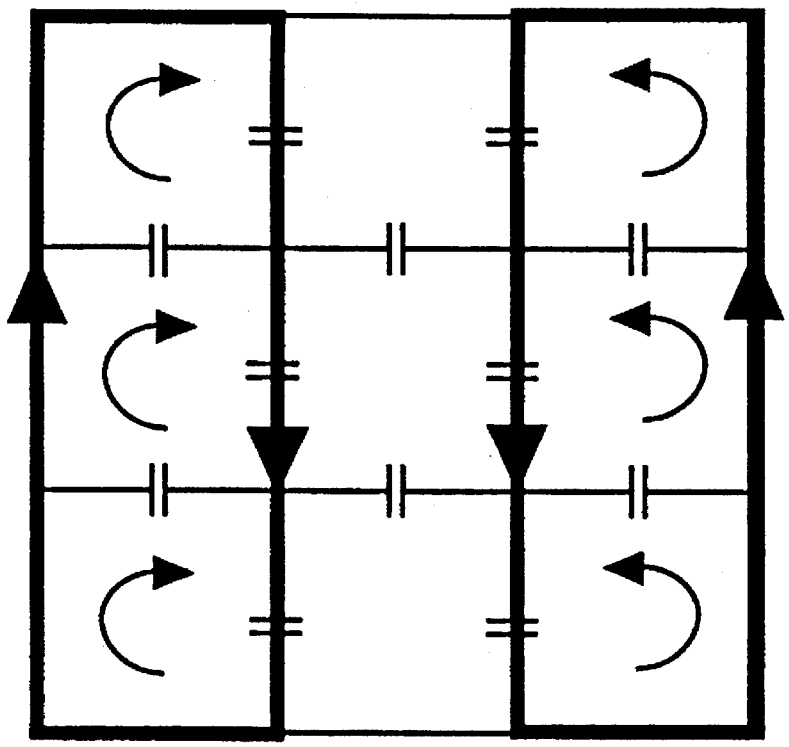
FIGS. 4(a) and 4(b) are diagrams of predicted mesh current distribution and resultant leg currents in the (0,1) and (1,0) modes of the 3×3 mesh planar resonator.
Figure 4A:
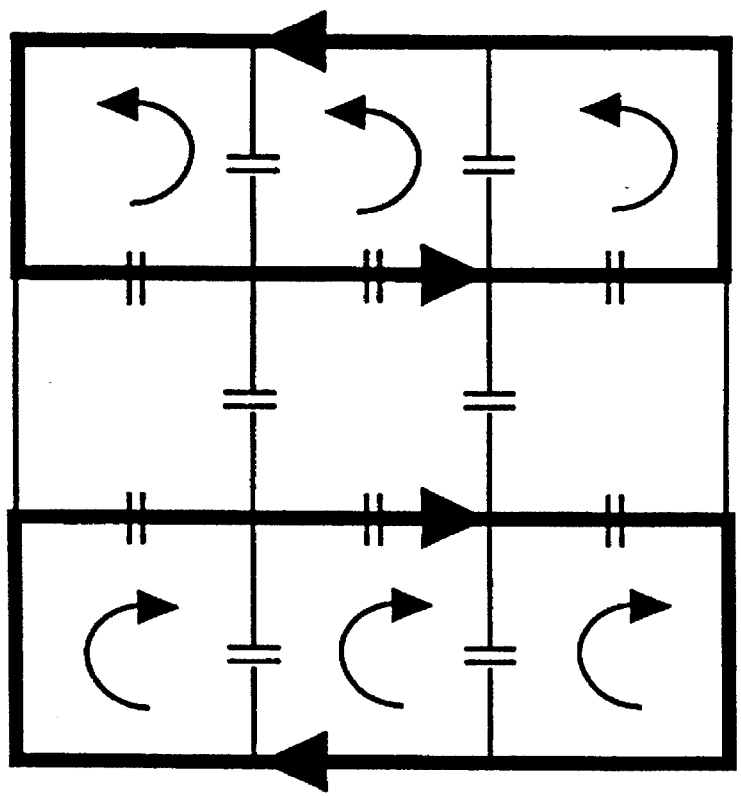
Figure 5A:
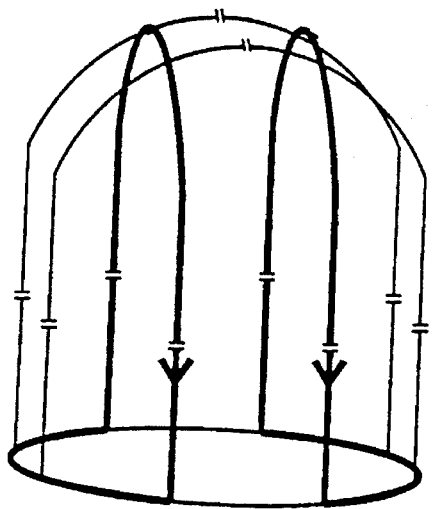
FIGS. 5(a) and 5(b) are diagrams of expected leg currents in the (0,1) and (1,0) modes of the 3×3 mesh dome resonator.
Figure 5B:
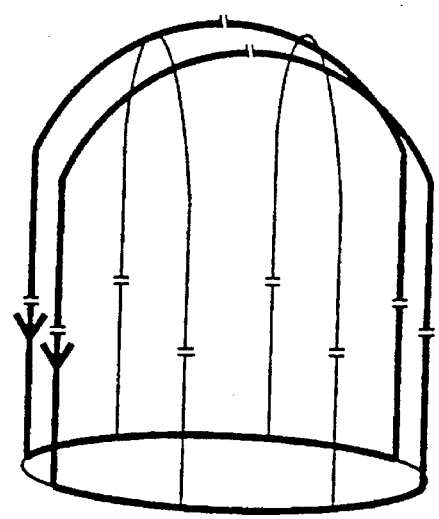

The resonant modes of the planar coil which are of interest are the members of the degenerate (0,1)(1,0) doublet. The directions of the mesh currents and the resulting leg currents for the doublet are shown in FIGS. 4(a) and 4(b), where it is assumed that A(1,0)=A(0,1). The amplitudes of the nonzero mesh currents are equal, and the amplitude of the current in each leg segment is obtained by adding the two mesh currents which share the segment. The topological equivalence between the 3×3 square-mesh planar resonator and the 3×3 mesh dome resonator suggests that the mode structures of the two will be similar. If we choose simply to neglect the effect of the physical distortion of the dome resonator, FIGS. 5(a) and 5(b) give the expected leg currents for the degenerate (0,1)(1,0) modes. Hence, the possibility exists that the 3×3 mesh dome resonator has a pair of degenerate modes which give rise to a pair of orthogonal homogeneous $B_1$ fields suitable for operation in quadrature. The results of procedures described below demonstrate that the 3×3 mesh dome resonator does indeed exhibit homogeneous quadrature modes which may be employed for head imaging.

Figure 2:
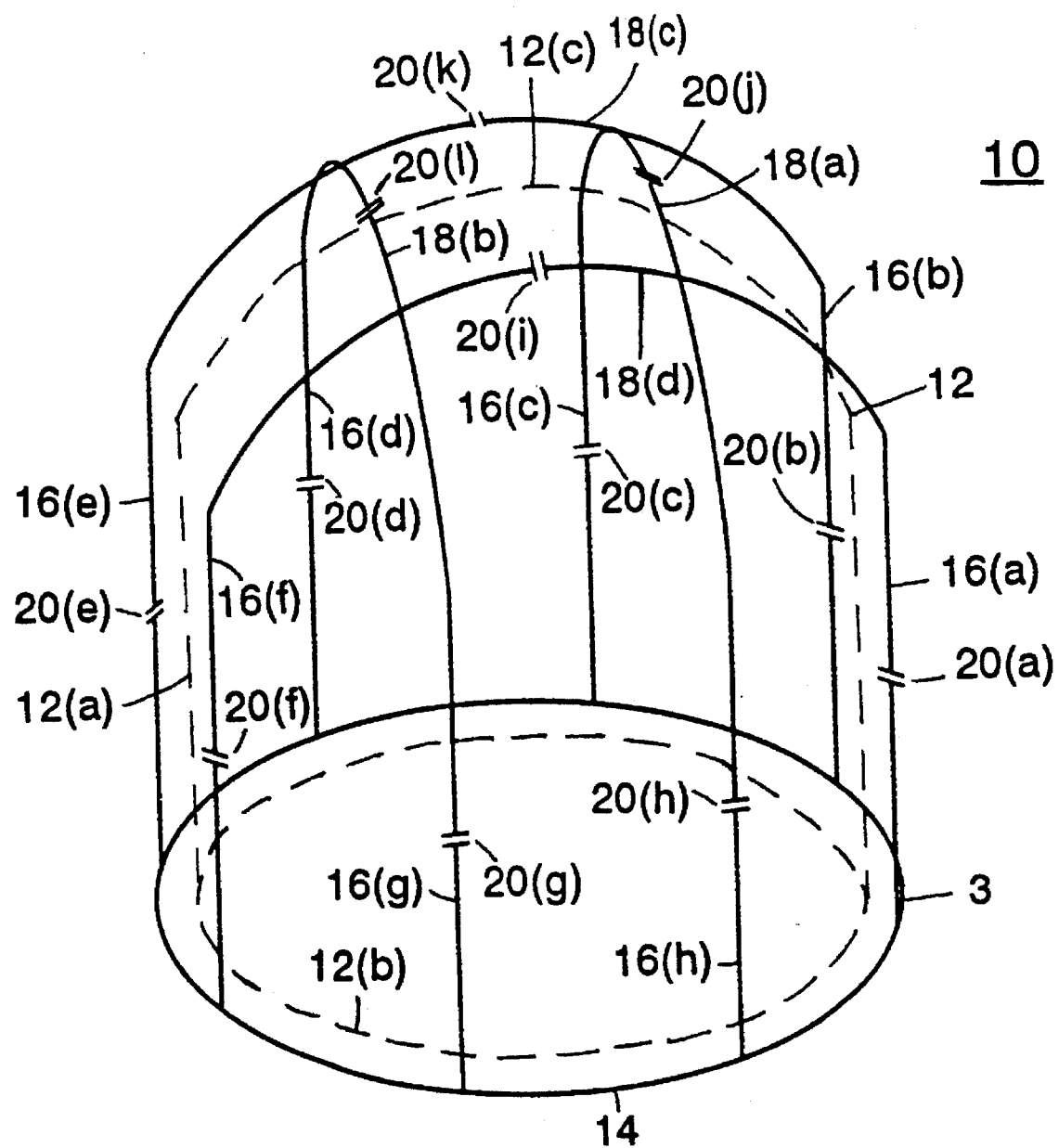
FIG. 2 is a drawing of a 3×3 mesh dome resonator according to another embodiment of the present invention.

A 3×3 mesh resonator according to another embodiment of the present invention is shown in FIG. 2. The 3×3 mesh resonator 10 of this embodiment is formed of adhesive-backed ½" copper tape mounted on a LUCITE frame 12. The LUCITE frame 12 consists of a cylinder section 12(a) with an open end 12(b) and a dome-shaped closed end 12(c). The copper tape is adhered to the LUCITE frame 12 in such a manner as to form end ring conductor 14, leg conductors 16(a)–16(h), and dome conductors 18(a)–18(d). The eight leg conductors 16(a)–16(h), extending from equally spaced positions on the end ring conductor 14, are each electrically connected to the end ring conductor 14 as well as to one dome conductor. That is, as seen in this Fig. pairs of leg conductors that are spaced 135/225 degrees apart are electrically connected to opposite ends of the same dome conductor. (The notation 135/225 means that conductors are spaced 135 degrees apart along one circumferential direction, and 225 degrees apart in the other circumferential direction. This notation is used elsewhere in this application with the same meaning). Capacitors 20(a)–(l) are electrically connected between gaps formed at the midpoints of each leg conductor 16(a)–16(h) and each dome conductor 18(a)–18(d). The cylindrical portion of the LUCITE frame 12 is 19.5 cm in length and 27.9 cm in diameter. The dome-shaped closed end 12(c) is 8.4 cm in height and 27.9 cm in diameter. When the capacitors 20(a)–(l) are 20.5 picofarad capacitors, the resonator 10 has its lowest resonant mode at approximately 63.9 MHz.

This radiofrequency 3×3 mesh dome-shaped resonator 10 is driven in quadrature through two series tuned inductive loops (not shown) mounted at 90 degrees with respect to one another on the LUCITE frame 12.

Figure 10:
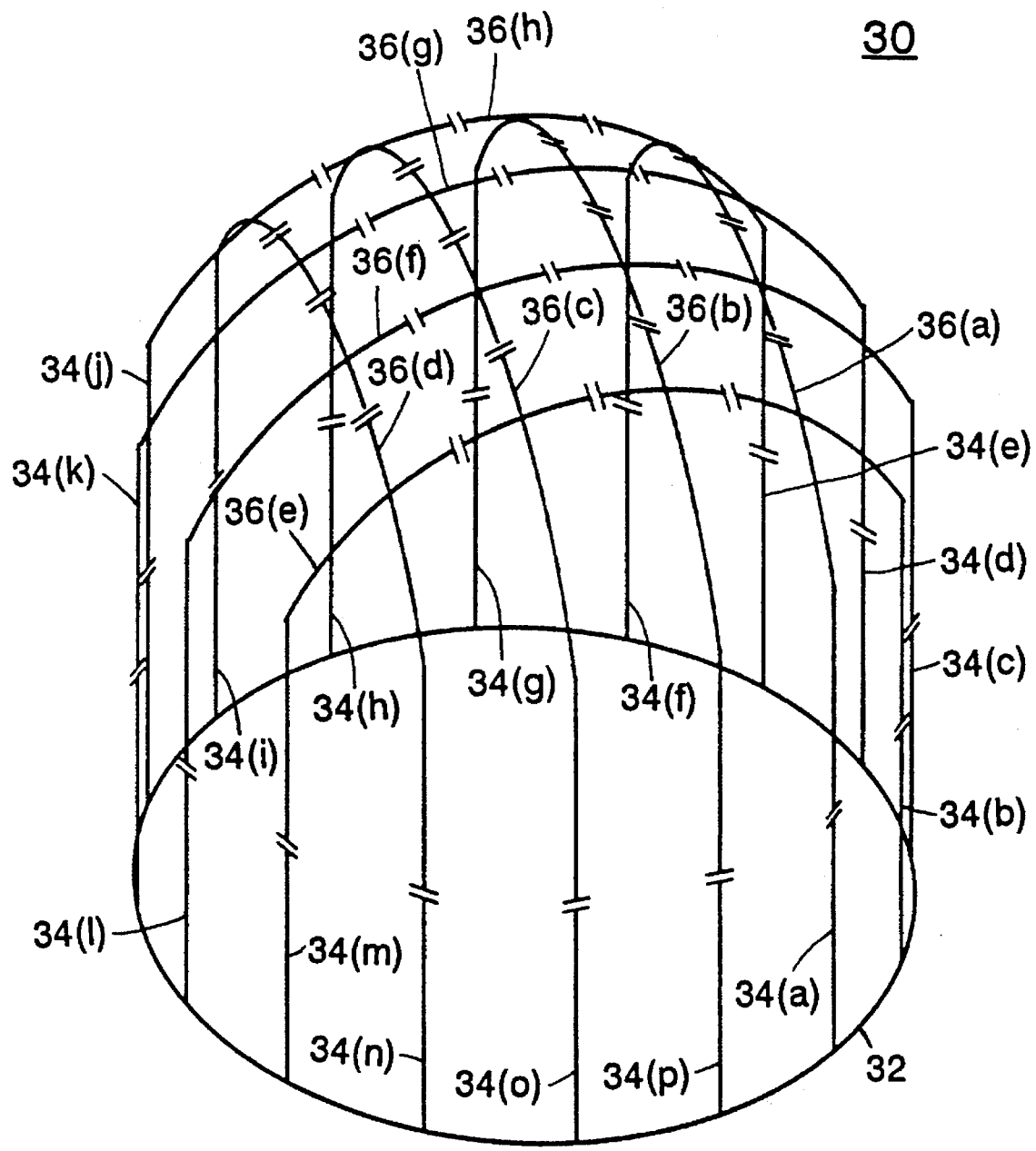
FIG. 10 is a schematic diagram of a 5×5 mesh dome resonator according to an embodiment of the present invention.

A 5×5 mesh resonator according to another embodiment of the present invention is shown schematically in FIG. 10. The 5×5 mesh resonator 30 is comprised of a 5×5 matrix of meshes formed of end ring conductor 32, sixteen leg conductors 34(a)–34(p), and eight dome conductors 36(a)–36(h). It is assumed that all coil segments have non-zero self-inductance. As is evident from FIG. 10, the structure is similar to that of an sixteen leg, low-pass birdcage except that one end-ring has been eliminated, and the legs have been routed across the end to form a dome-like geometry. The segments which intersect on the dome are electrically joined.

Figure 11:
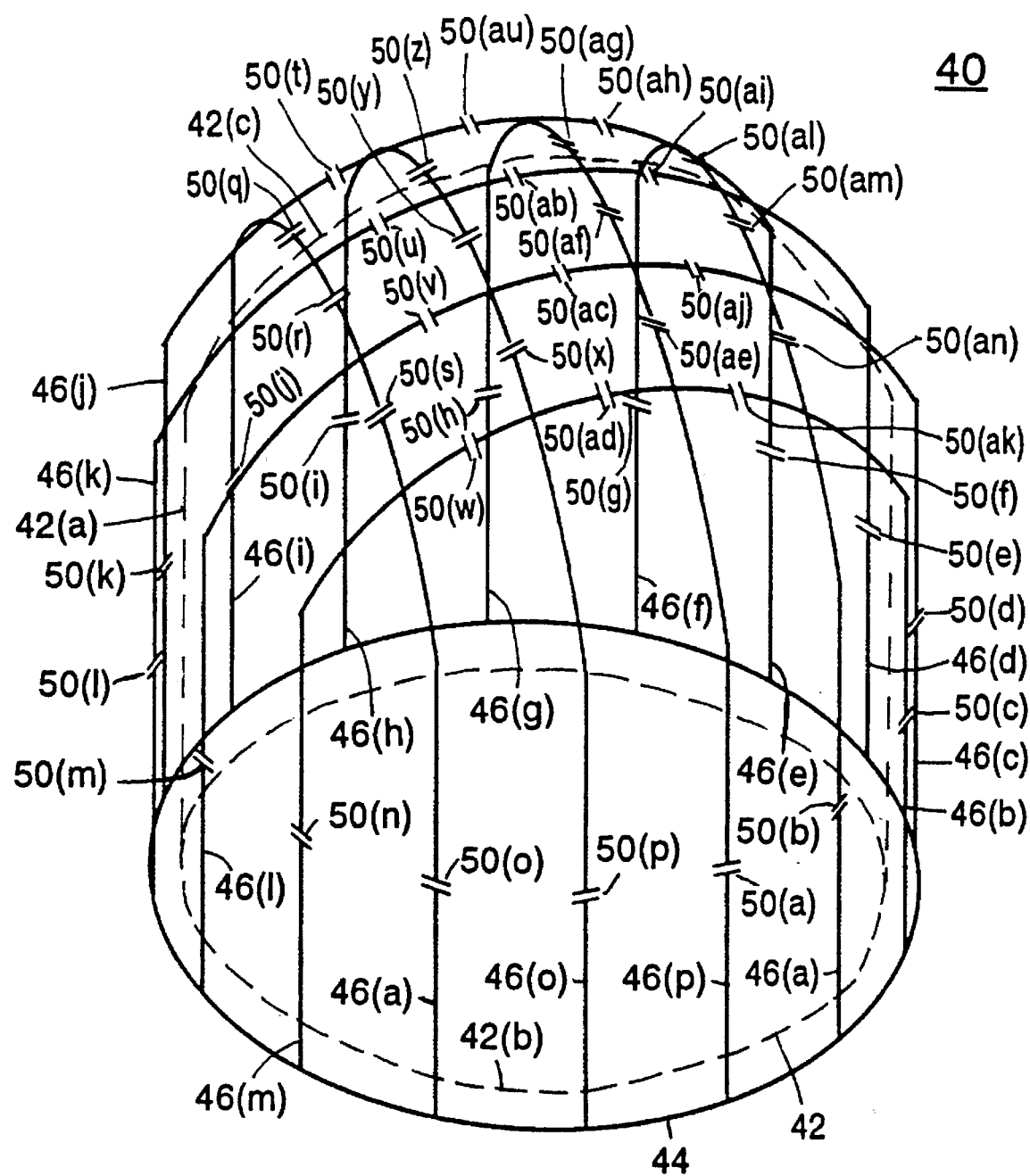
FIG. 11 is a drawing of a 5×5 mesh dome resonator according to another embodiment of the present invention.
Figure 12:
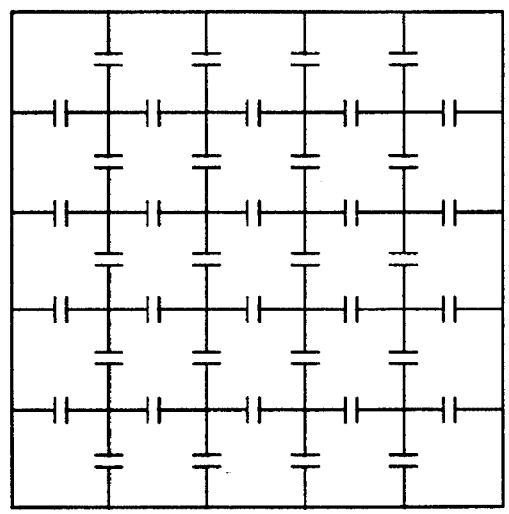
FIG. 12 is a diagram of a 5×5 square mesh planar resonator.
Figure 13A:
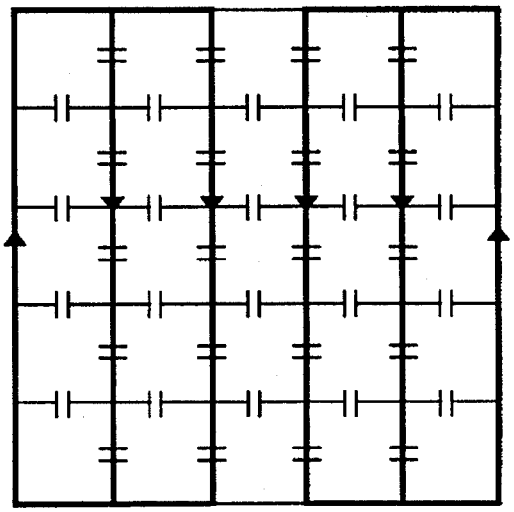
FIGS. 13(a) and 13(b) are diagrams of predicted mesh current distribution and resultant leg currents in the (0,1) and (1,0) modes of the 5×5 mesh planar resonator.
Figure 13B:
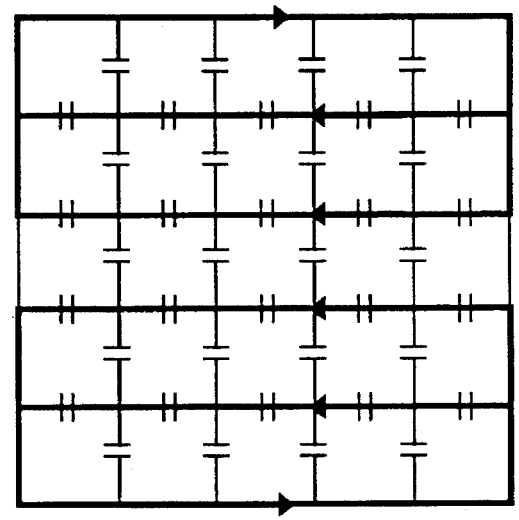

A 5×5 mesh resonator according to another embodiment of the present invention is shown in FIG. 11. The 5×5 mesh resonator 40 of this embodiment is formed of adhesive-backed ½" copper tape mounted on a LUCITE frame 42. The LUCITE frame 42 consists of a cylinder section 42(a) with an open end 42(b) and a dome-shaped closed end 42(c). The copper tape is adhered to the LUCITE frame 42 in such a manner as to form end ring conductor 44, leg conductors 46(a)–46(p), and dome conductors 48(a)–48(h). The sixteen leg conductors 46(a)–46(p), extending from equally spaced positions on the end ring conductor 44, are each electrically connected to the end ring conductor 44 as well as to one dome conductor. That is, as seen in this Fig. pairs of leg conductors that are spaced 112.5/247.5 degrees apart are electrically connected to opposite ends of the same dome conductor. Capacitors 50(a)–50(an) are electrically connected between gaps formed at the midpoints of each leg conductor 46(a)–46(p) and between gaps formed between intersection points of the dome conductors 48(a)–48(h). The cylindrical portion of the LUCITE frame 42 is 19.5 cm in length and 27.9 cm in diameter. The dome-shaped closed end 12(c) is 8.4 cm in height and 27.9 cm in diameter. When the capacitors 50(a)–50(an) are 21.4 picofarad capacitors, the resonator 40 has its lowest resonant mode at approximately 63.9 MHz.

This radiofrequency 5×5 mesh dome-shaped resonator 40 is driven in quadrature through two series tuned inductive loops (not shown) mounted at 90 degrees with respect to one another on the LUCITE frame 42.

Experiments conducted using the apparatus of the present invention will now be described.

MATERIALS AND METHODS

In one experiment to test the resonant operation predicted above, three RF resonators were constructed: 1) a planar 3×3 mesh of dimensions 12 cm×12 cm, 2) a clinical-size 3×3 mesh dome resonator for head imaging, and 3) an eight-leg low-pass birdcage with the same dimensions as the clinical dome coil. Resonators were constructed on ⅛" thick LUCITE using ½" copper tape (3M, Austin, Tex.) and porcelain chip capacitors (American Technical Ceramics, Huntington Station, N.Y.). The cylindrical portion of the 3×3 mesh dome resonator was 19.5 cm in length and 27.9 cm in diameter. The LUCITE dome was cut from a 12" hemisphere to fit the 11" diameter cylinder in an attempt to approximately conform to the shape of the human head. The extent of the arches of the coil was 8.4 cm bringing the total coil length to 27.9 cm. The birdcage resonator diameter and length were each 27.9 cm.

The expected transverse $B_1$ fields of the 3×3 mesh dome resonator and the birdcage were calculated using the Biot-Savart law. Equal currents were supplied to each coil. In the leg currents mode of the dome resonator, only two current loops exist (see FIGS. 5(a) and 5(b)) and the currents have equal amplitudes.

Resonant frequencies of the structures were identified using a weakly coupled inductive loop connected to the impedance bridge accessory of a network analyzer (Hewlett Packard model 4195A, Palo Alto, Calif.) which was operating in the impedance measurement mode. Qualitatively, the homogeneity of each of the degenerate (0,1)(1,0) modes of the 3×3 mesh dome resonator was ascertained by noting the variation in signal due to changes in $B_1$ flux as the pickup loop was moved about within the resonator. The porcelain chip capacitors were used to tune this mode to approximately 63.9 MHz. The dome and birdcage resonators were driven using inductively-coupled series-tuned drive loops positioned over meshes 90 degrees apart. Fine tuning and mode isolation was accomplished using 0–120 pF variable capacitors (Voltronics, Denville, N.J.) mounted on four different legs.

Quadrature operation of the volume resonators was obtained using a 90 degree hybrid splitter/combiner (Triangle Microwave, East Hanover, N.J.). Mode isolation was tested on the benchtop by driving each coil through the splitter with a sweep generator (Wavetek, Model 1062, San Diego, Calif.) in continuous wave mode at 63.9 MHz. The flux through an inductive pickup loop was monitored on a 100 MHz oscilloscope (Tektronix, model 2236, Beaverton, Oreg.) to determine the ellipticity of the quadrature field (8) and adjustments were made to the tune and isolation capacitors if necessary. Transmission measurements on the network analyzer demonstrated isolation of greater than 25 dB between the channels when each resonator was loaded with a 3 liter cylindrical phantom comprised of 50 mM saline doped with 5 mM $CuSO_4$ which approximated loading by the human head.

On the clinical scanner (General Electric, Signa 1.5 Tesla, Milwaukee, Wis.), quadrature operation was optimized by adjustment of tune and isolation capacitors to maximize the projected signal from an axial slice through the center of the phantom described above. The final test of quadrature operation was done by reversing the transmit and receive cables to obtain a null image of the phantom (8). The transverse $B_1$ field of each volume coil was indirectly mapped by determining the necessary transmitter power for a 90 degree flip angle at points along the central axis of the coil. Finally, head images were obtained from volunteers.

In another experiment to test the resonant operation predicted above, two RF resonators were constructed: 1) a clinical-size 5×5 mesh dome resonator for head imaging, and 2) a sixteen-leg low-pass birdcage with the same dimensions as the clinical dome coil. Resonators were constructed on ⅛" thick LUCITE material using ½" copper tape (3M, Austin, Tex.) and porcelain chip capacitors (American Technical Ceramics, Huntington Station, N.Y.). The cylindrical portion of the 5×5 mesh dome resonator was 19.5 cm in length and 27.9 cm in diameter. The LUCITE dome was cut from a 12" hemisphere to fit the 11" diameter cylinder in an attempt to approximately conform to the shape of the human head. The extent of the arches of the coil was 8.4 cm bringing the total coil length to 27.9 cm. The birdcage resonator diameter and length were each 27.9 cm.

Resonant frequencies of the structures were identified using a weakly coupled inductive loop connected to the impedance bridge accessory of a network analyzer which was operating in the impedance measurement mode. The 5×5 mesh dome and birdcage resonators were driven using inductively-coupled series-tuned drive loops positioned over meshes 90 degrees apart. Quadrature operation of the volume resonators was obtained using a 90 degree hybrid splitter/combiner.

On the clinical scanner (General Electric, Signa 1.5 Tesla, Milwaukee, Wis.), quadrature operation was optimized by adjustment of tune and isolation capacitors to maximize the projected signal from an axial slice through the center of a 2 liter, 50 mM NaCl phantom.

The transverse $B_1$ field of each volume coil was mapped by determining the necessary transmitter power for a 90 degree flip angle at points along the central axis of the coil. Finally, head images were obtained from volunteers.

RESULTS

Figure 6A:
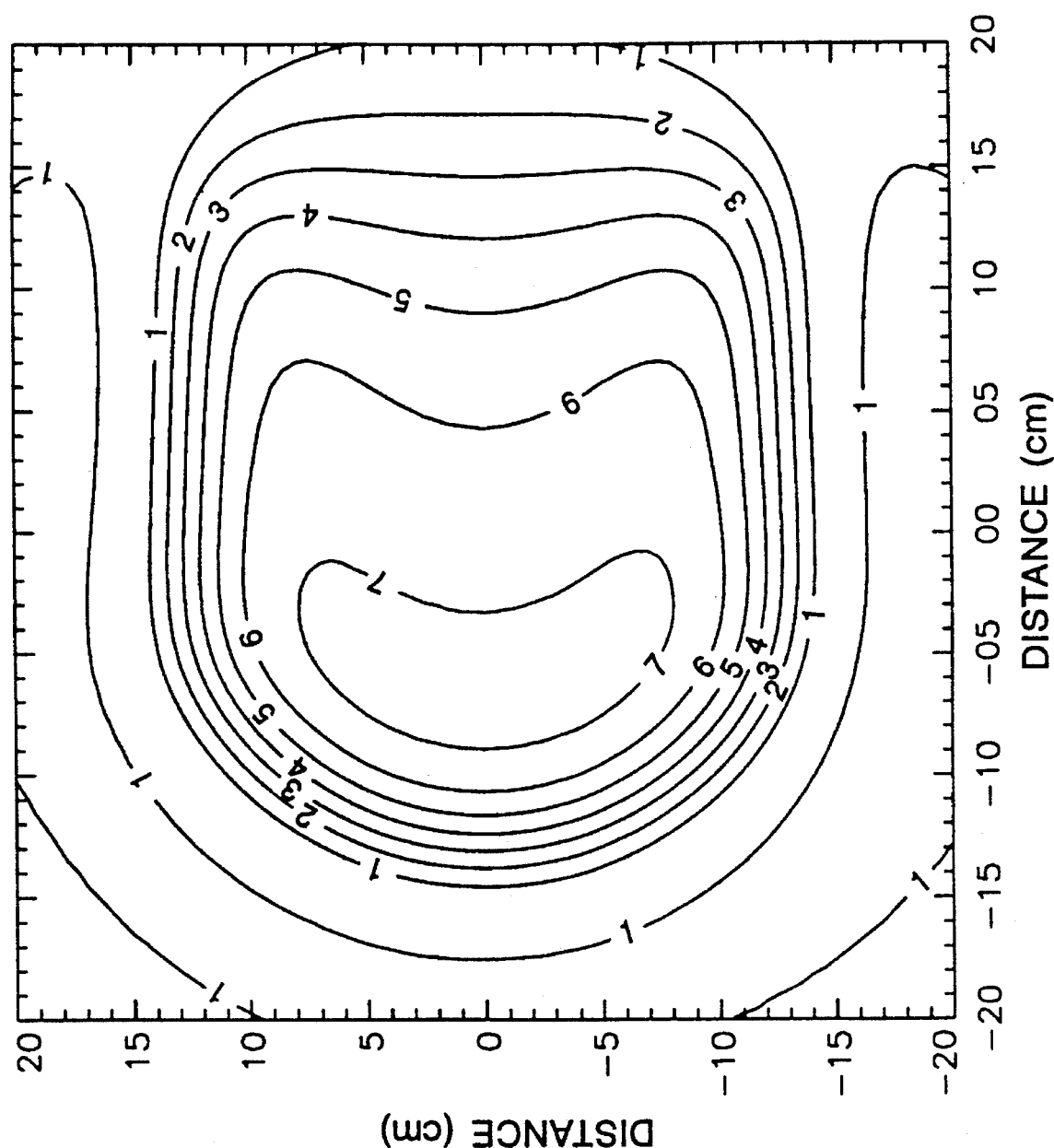
FIG. 6(a) shows a $B_1$ contour plot generated from Biot-Savart calculations of the transverse $B_1$ fields of a 3×3 mesh dome resonator of the instant invention at a longitudinal cross section through the center of the 3×3 mesh dome coil.
Figure 6B:
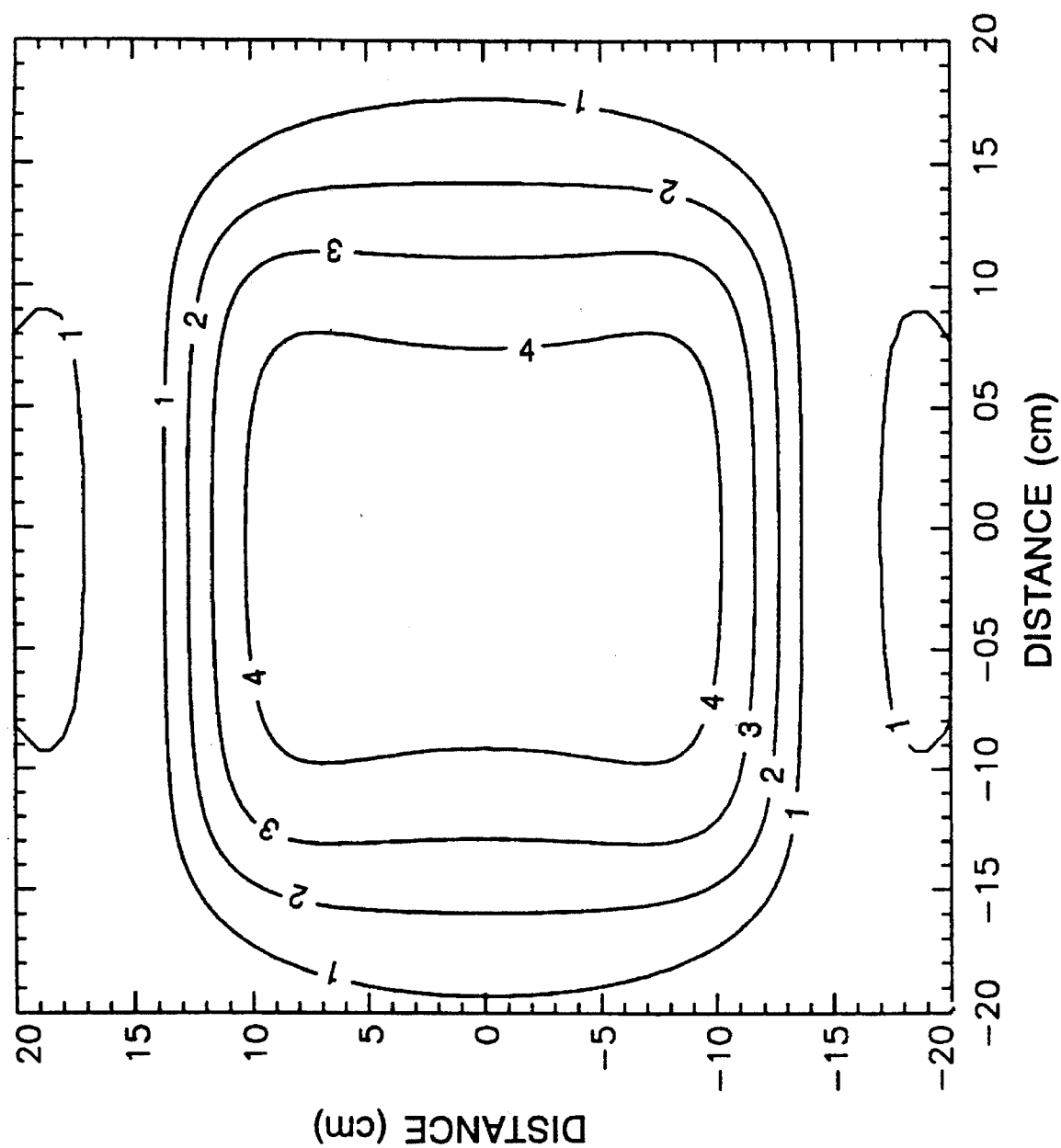
FIG. 6(b) shows a $B_1$ contour plot generated from Biot-Savart calculations of the transverse $B_1$ fields of an eight leg low-pass birdcage coil at a longitudinal cross section through the center of the eight leg birdcage coil.
Figure 6C:
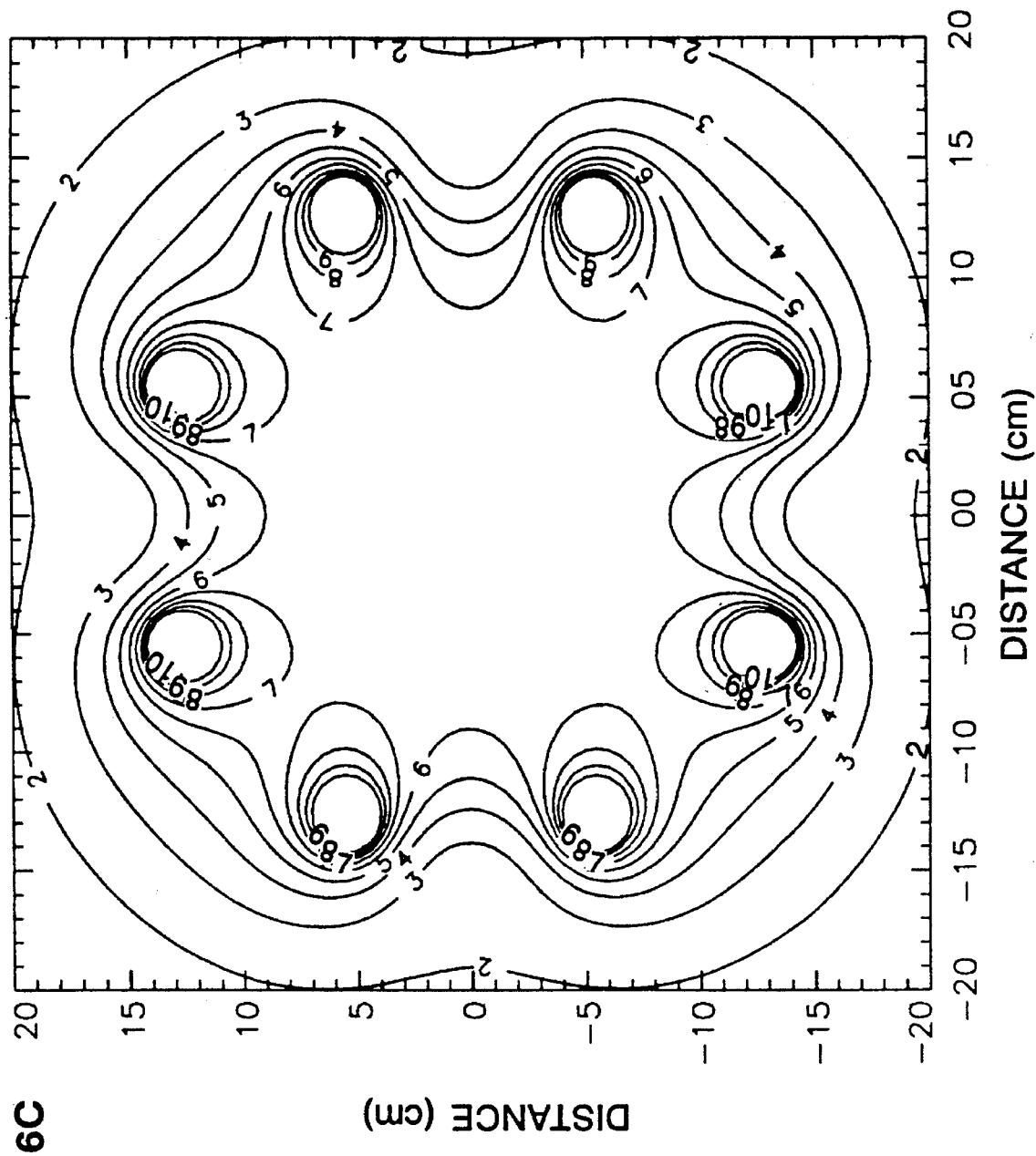
FIG. 6(c) shows a $B_1$ contour plot generated from Biot-Savart calculations of the transverse $B_1$ fields of a 3×3 mesh dome resonator of the instant invention at an axial cross section through the center of the 3×3 mesh dome coil representing the average quadrature field.
Figure 6D:
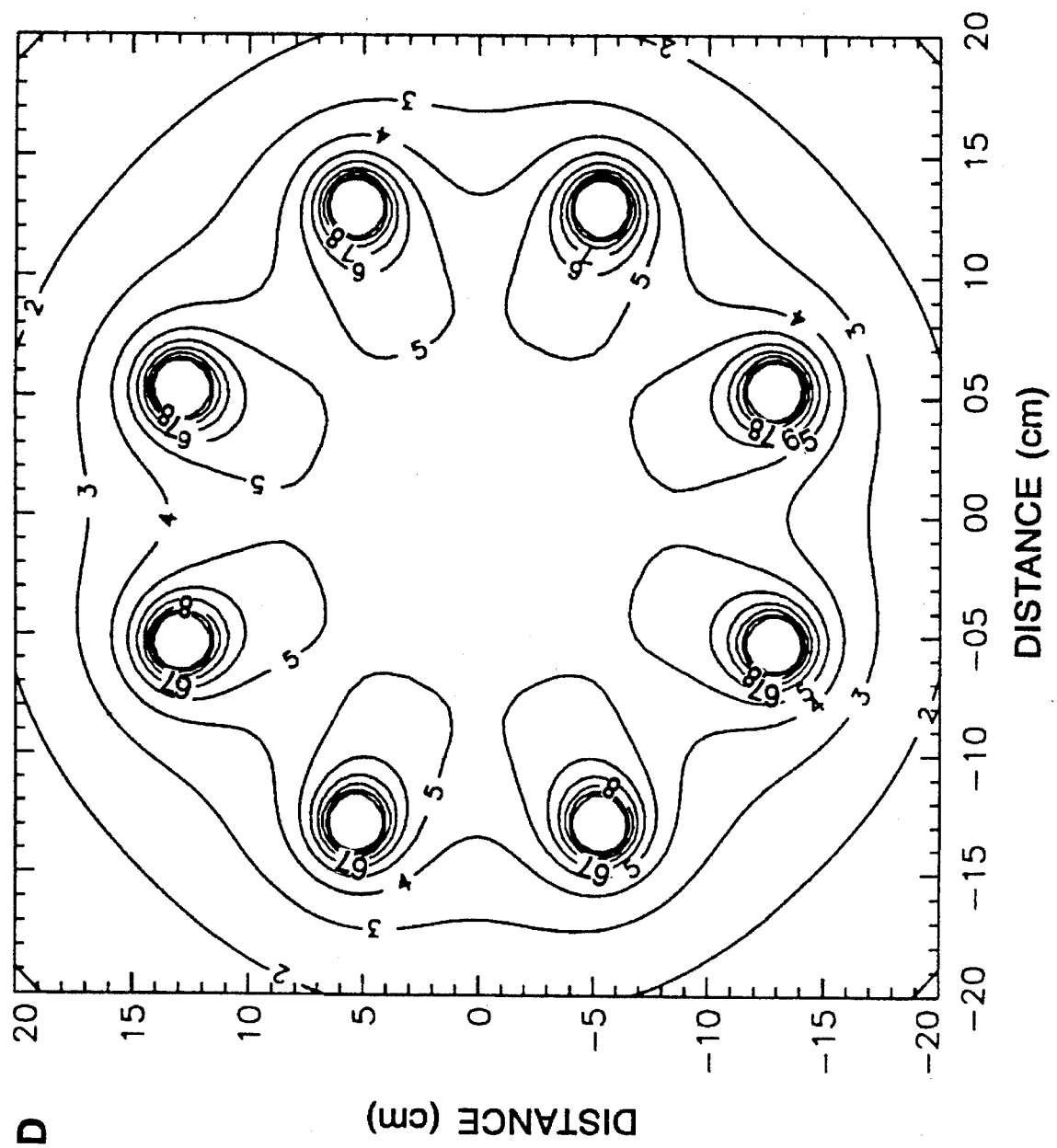
FIG. 6(d) shows a $B_1$ contour plot generated from Biot-Savart calculations of the transverse $B_1$ fields of an eight leg low-pass birdcage coil at an axial cross section through the birdcage center.

FIGS. 6(a)–6(d) contain the results of the Biot-Savart calculations for the 3×3 mesh dome resonator and its birdcage counterpart. Identical scale factors were used in all plots. FIG. 6(a) represents a snapshot in time of the transverse $B_1$ field in a cross section along the long axis of the 3×3 mesh dome resonator. FIG. 6(b) represents a snapshot in time of the transverse $B_1$ field in a cross section along the long axis of the birdcage resonator. While similar sensitivity was predicted for the resonators at their open ends, the 3×3 mesh dome was expected to have increased sensitivity at the closed end. In FIG. 6(c) an axial profile of the average quadrature $B_1$ field at the longitudinal center of the 3×3 mesh dome resonator is presented. In FIG. 6(d) an axial profile of the average quadrature $B_1$ field at the longitudinal center of the birdcage resonator is presented. The four-fold symmetry of the 3×3 mesh dome operating in quadrature resulted in axial homogeneity comparable to that of the eight leg birdcage.

The experimentally observed resonant modes of the 3×3 mesh planar and dome resonators are shown in FIG. 7. The mode structures were clearly similar and both resonators demonstrated low pass characteristics, i.e., the lowest frequency mode was the most homogeneous. The frequency spacings of all modes of the dome resonator except the (2,2) mode were compressed compared to those of the planar resonator. As indicated by the asterisk, the (2,2) mode of the dome resonator consisted of current flowing only in the central mesh at the top of the coil, which was not the predicted mesh current distribution. The reduction in inductance due to the limited current path in this mode most likely resulted in the high resonant frequency.

Figure 8:
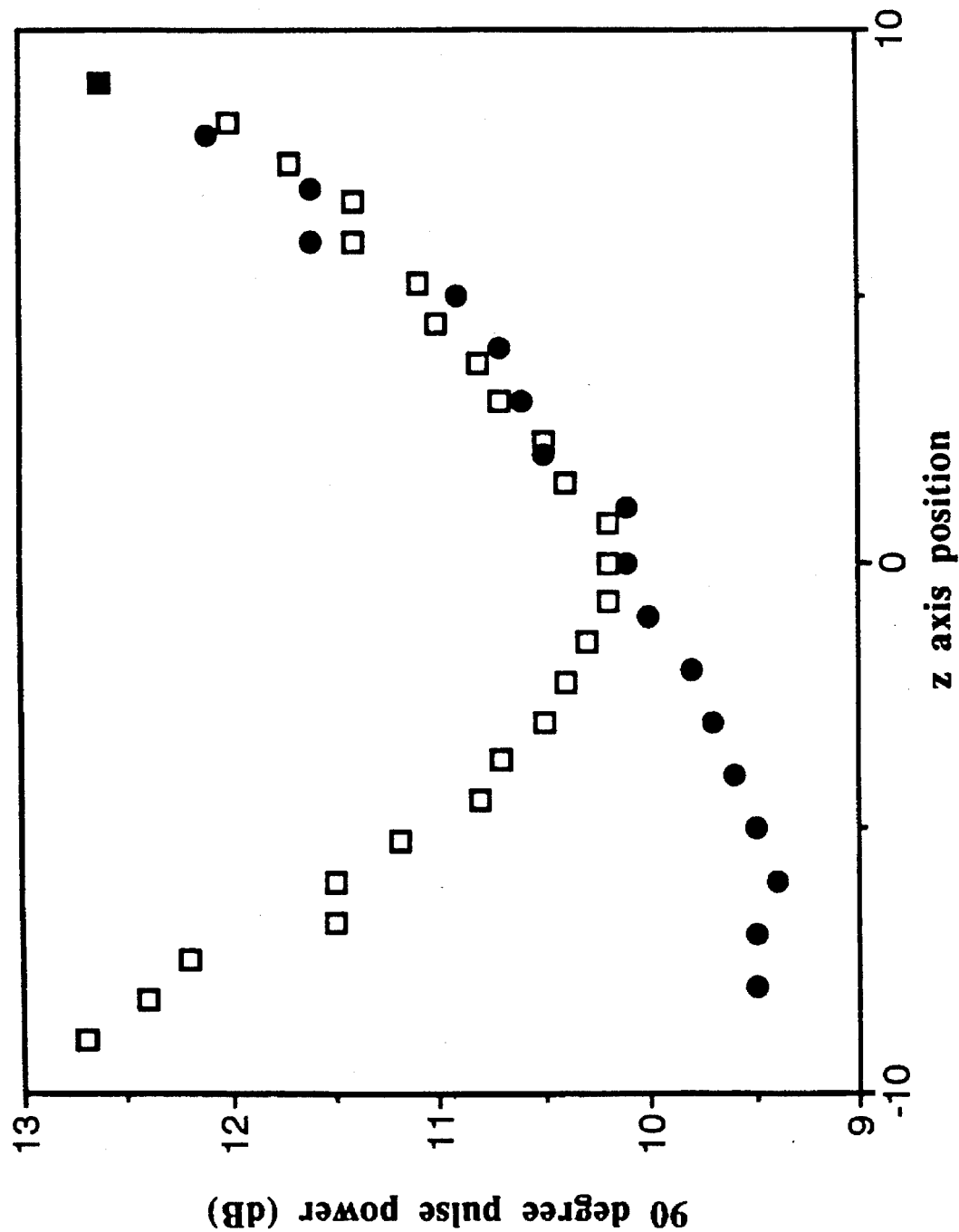
FIG. 8 is a graph showing relative 90 degree pulse power (dB) vs. z position in the 3×3 mesh dome resonator (●, and the eight-leg birdcage (□)

A plot of the relative 90 degree pulse power (in dB) vs. z-axis position for the 3×3 mesh dome resonator and the eight leg low-pass birdcage is shown in FIG. 8. At the open end (positive z direction), the 90 degree pulse power values of the two coils were similar, indicating that the $B_1$ field strength of the dome coil was quite similar to that of the birdcage. However, at the closed end there was an increase in $B_1$ intensity of the dome resonator over the birdcage as indicated by the reduction in power necessary for a 90 degree flip angle.

Figure 9A:
FIG. 9(a) shows a sagittal slice image of the head of a normal volunteer obtained with the 3×3 mesh dome resonator of the instant invention at a nominal transmitter power of 0.22 kW.
Figure 9B:
FIG. 9(b) shows a sagittal slice image of the head of a normal volunteer obtained with the eight-leg birdcage head coil with nominal power of 0.41 kW.
Figure 9C:
FIG. 9(c) shows a sagittal slice image of the head of a normal volunteer obtained with the eight-leg birdcage head coil with nominal power of 0.22 kW.

FIG. 9(a) shows a sagittal head image of a 38 year old normal volunteer acquired with the 3×3 dome resonator of the instant invention. FIGS. 9(b) and 9(c) show sagittal head images of a 38 year old normal volunteer acquired with the eight-leg birdcage coil. In each case, the coil was centered in the field of view and the bridge of the nose was positioned at the coil center. The spin echo scan parameters were: slice thickness =5 mm, field of view=24 cm, repetition time=500 ms, echo time=11 ms. Gain, window, and level parameters were identical. The transmitter power in FIGS. 9(a) and 9(b) was chosen by the autoprescan algorithm of the scanner to maximize the integrated signal over the slice. An advantage in sensitivity in the dome resonator was visible in the superior region of the head. The nominal transmitter power corresponding to a relative power value of 20 dB was 3 kW. In these images, the 3×3 mesh dome resonator of this embodiment required approximately 0.22 kW while the birdcage required 0.41 kW to excite the same sagittal slice. FIG. 9(c) contains the image which resulted when the birdcage coil was supplied with a nominal power of 0.22 kW.

Figure 14A:
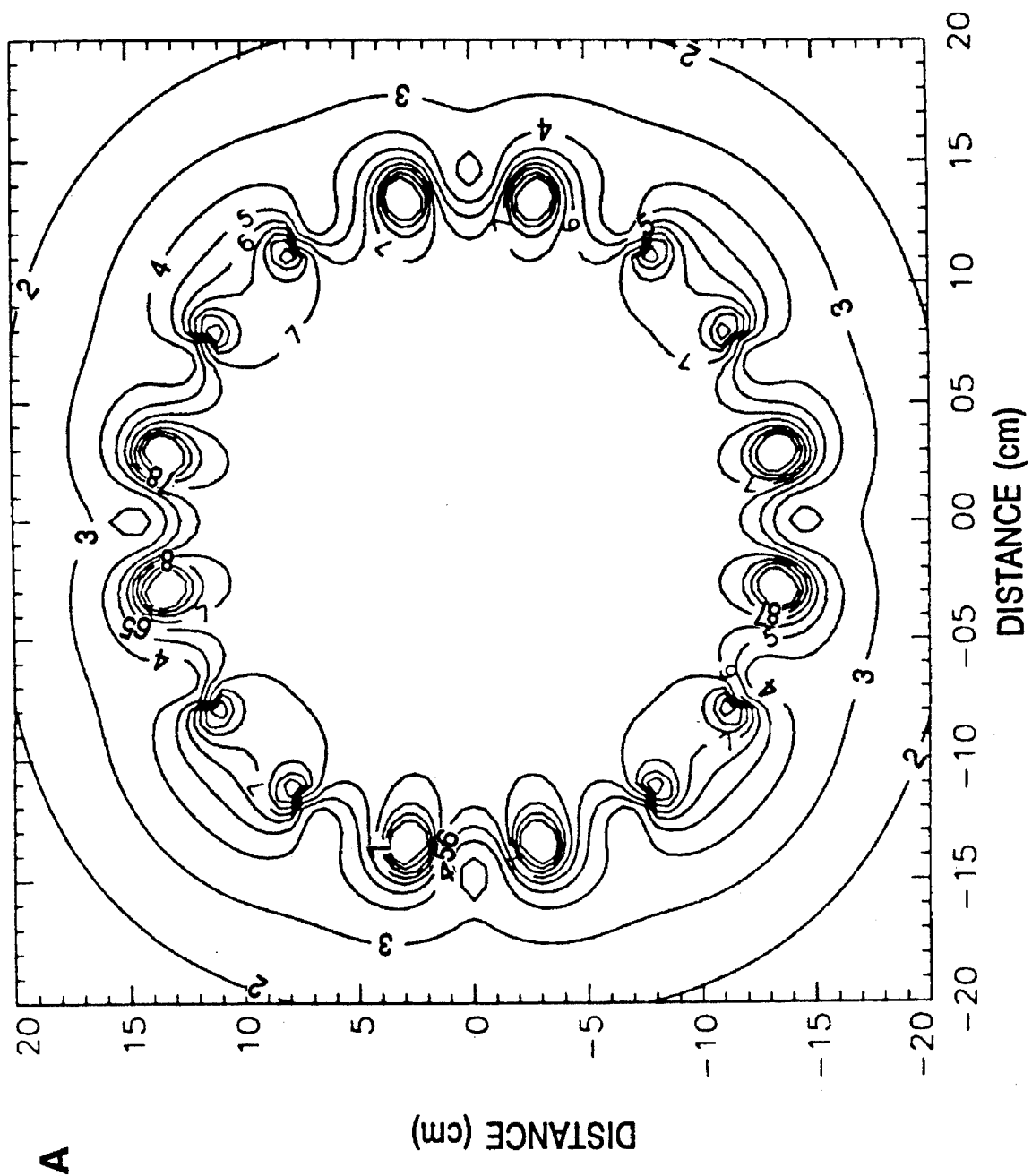
FIG. 14(a) shows a $B_1$ contour plot generated from Biot-Savart calculations of the transverse $B_1$ fields of a 5×5 mesh dome resonator of the instant invention at an axial cross section through the center of the 5×5 mesh dome coil representing the average quadrature field.
Figure 14B:
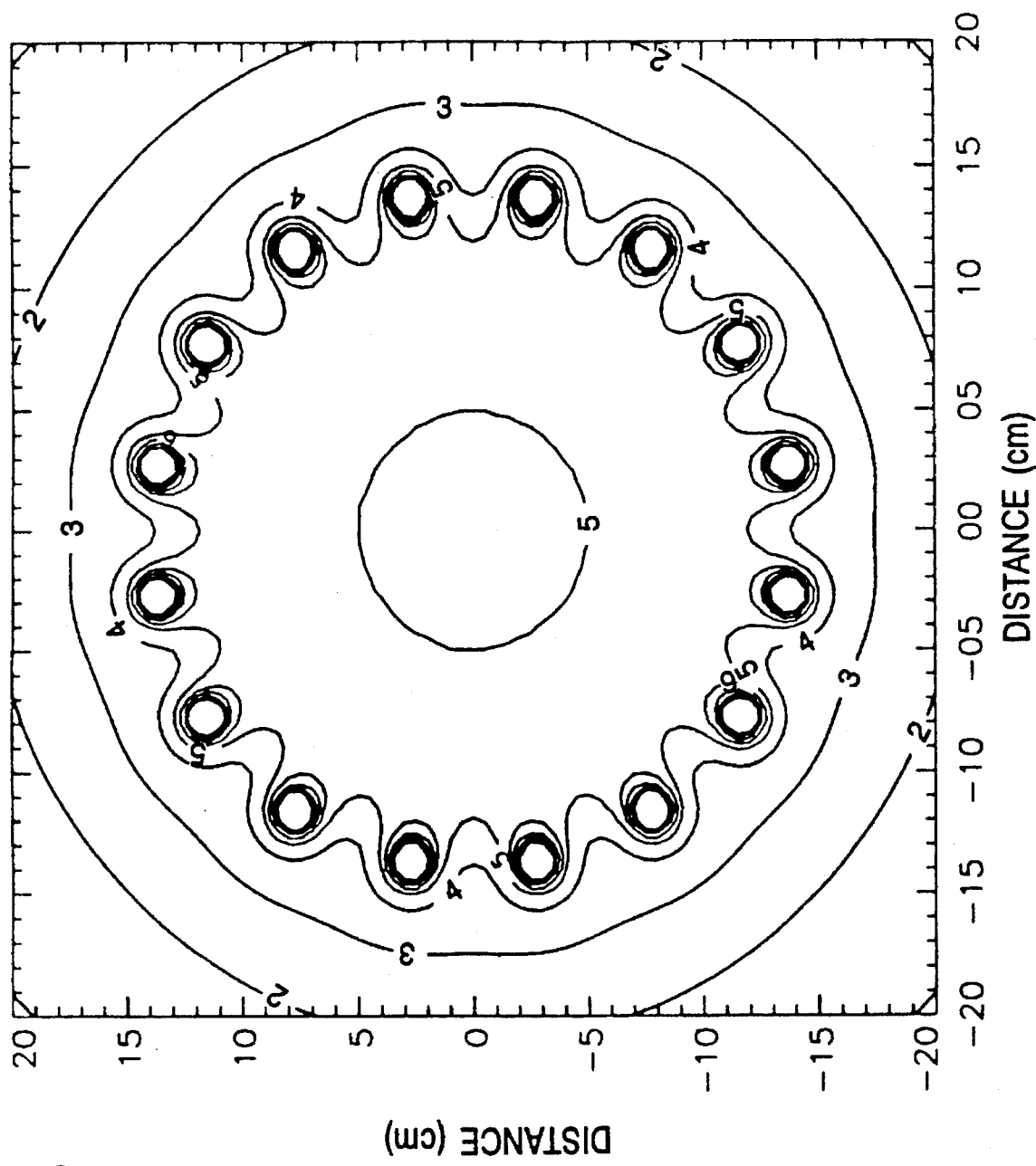
FIG. 14(b) shows a $B_1$ contour plot generated from Biot-Savart calculations of the transverse $B_1$ fields of a sixteen leg low-pass birdcage coil at an axial cross section through the birdcage center.

FIGS. 14(a) and 14(b) contain the results of the Biot-Savart calculations for the 5×5 mesh dome resonator and its birdcage counterpart. Identical scale factors were used in all plots. In FIG. 14(a) an axial profile of the average quadrature $B_1$ field at the longitudinal center of the 5×5 mesh dome resonator is presented. In FIG. 14(b) an axial profile of the average quadrature $B_1$ field at the longitudinal center of the birdcage resonator is presented. The 5×5 mesh dome operating in quadrature resulted in axial homogeneity comparable to that of the sixteen leg birdcage.

Figure 15B:
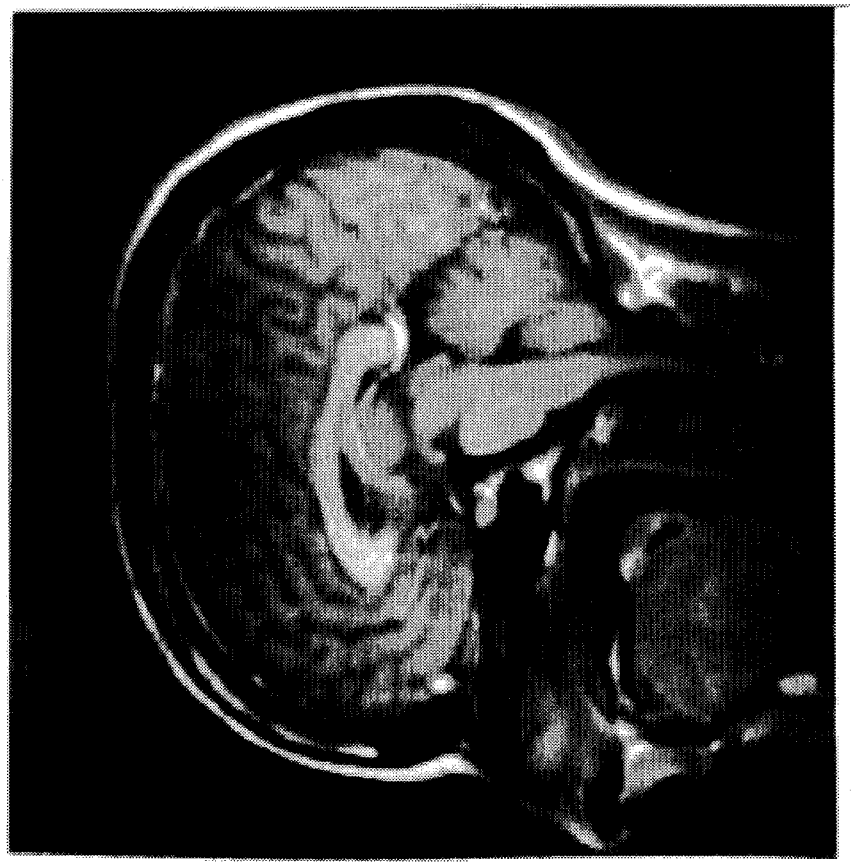
FIG. 15(b) shows a sagittal slice image of the head of a normal volunteer obtained with the sixteen leg birdcage head coil.
Figure 15A:
FIG. 15(a) shows a sagittal slice image of the head of a normal volunteer obtained with the 5×5 mesh dome resonator of the instant invention.

FIG. 15(a) shows a sagittal head image of a volunteer acquired with the 5×5 dome resonator of the instant invention. FIG. 15(b) shows a sagittal head image of a volunteer acquired with the sixteen leg birdcage coil. The test parameters were: slice thickness=5 mm, repetition time=500 ms, echo time=11 ms. The superior sensitivity in the dome end of the 5×5 mesh dome resonator of the instant invention is evident.

DISCUSSION

The experimentally determined mode structure of the 3×3 mesh dome resonator of the instant invention corresponded well to the theoretically predicted mode structure of the planar 3×3 resonator despite the physical deformation. This correspondence indicated that an understanding of the behavior of the simpler planar geometry may be adequate for predicting the behavior of more complicated 2 D resonant LC networks.

The 3×3 and 5×5 mesh dome resonators demonstrate a successful clinical application of two-dimensional ladder network resonators. The high sensitivity in the closed end and good homogeneity predicted by the Bio-Savart theory were confirmed by the on-axis power measurements and the images. The high-quality volunteer head image in FIGS. 9(a) and 15(a) show clinical utility for imaging. One possible specific application is in functional imaging where SNR is at a premium.

In vivo nuclear magnetic resonance spectroscopy of metabolites also suffers from low sensitivity and could benefit from application of the instant invention. A shortened, quadrature version of a birdcage coil has been implemented for $^{31}p$ chemical shift imaging of the human head and has been found to improve the sensitivity of the experiment (9). The 3×3 dome resonator length used in the above test was made the same as that of the standard clinical birdcage coil for purposes of comparison. However, the length of the cylindrical portion of the coil could be reduced to possibly improve the sensitivity in the closed end.

The theory of operation of the structure described above is predicts a degenerate doublet whose homogeneity results in high quality images of the human head. The 3×3 and 5×5 mesh dome resonators are thus two examples of new coil geometries based upon two-dimensional ladder network resonators which have considerable clinical potential.

It must be noted that although the present invention is described by reference to particular embodiments thereof, many changes and modifications of the invention may become apparent to those skilled in the art without departing from the spirit and scope of the invention, which is only limited by the appended claims. For example, the resonator geometry may be changed to include a matrix of a different number of meshes, other than the 3×3 and 5×5 mesh geometries described above. Therefore, the embodiments shown and described are only illustrative, not restrictive.

REFERENCES

1. C. E. Hayes, W. A. Edelstein, J. F. Schenck, O. M. Mueller, M.Eash, J. Magn. Reson. 63, 622–628 (1985).
2. J. Tropp, J. Magn. Reson. 83, 51–62 (1989).
3. P. M. Joseph, D. Lu, IEEE Trans. Med. Imag. 8(3), 286–294 (1989).
4. D. Ballon, M. C. Graham, S. Miodownik, J. A. Koutcher, J. Magn. Reson. 90, 131–140 (1990).
5. D. Ballon, K. L. Meyer, proceedings of the Society of Magnetic Resonance in Medicine, Twelfth Annual Meeting, New York, p. 1323 (1993).
6. A. P. French, "Vibration and Waves," 181–188, Thomas Nelson and Sons, Ltd. London, 1971.
7. I. G. Main, "Vibrations and Waves in Physics," Third Edition, 158–159, Cambridge University Press, Cambridge, 1993.
8. G. H. Glover, C. E. Hayes, N. J. Pelc, W. A. Edelstein, O. M. Mueller, H. R. Hart, C. J. Hardy, M. O'Donnell, W. D. Barber, J. Magn. Reson. 64, 255–270 (1985).
9. P. A. Bottomley, H. C. Charles, P. B. Roemer, D. Flamig, H. Engeseth, W. A. Edelstein, O. M. Mueller, Magn. Reson. Med. 7,319–336, (1988).

What is claimed is:

1. A radiofrequency resonator for nuclear magnetic resonance imaging and spectroscopy of a patient, comprising:

a hollow cylindrical support structure with an outer surface, an inner diameter, an open end, and a dome-shaped closed end;

an end ring conductor attached to the outer surface of the hollow cylindrical support structure adjacent the open end;

eight substantially equal length leg conductors with respective first ends, second ends, and midpoints, each of the respective first ends being electrically joined to the end ring conductor at positions spaced substantially 45 degrees apart from one another, each of the eight leg conductors being attached to the outer surface of the hollow cylindrical support structure and each respective second end of the eight leg conductors terminating adjacent the dome-shaped closed end; and four dome conductors attached to the outer surface of the dome-shaped closed end, each of the four dome conductors having respective midpoints and two endpoints, an endpoint of each dome conductor being electrically joined to respective second ends of pairs of leg conductors spaced 135/225 degrees apart from one another, whereby each dome conductor is connected to two of said leg conductors and whereby each leg conductor is connected to one dome conductor;

wherein each of said four dome conductors intersects two of said four dome conductors at two intersection points and wherein each of said four dome conductors that intersect each of said two dome conductors are electrically joined to said two intersecting dome conductors at said intersection points.

2. The radiofrequency resonator according to claim 1, further comprising:

four capacitors electrically bridging four respective gaps formed in said four dome conductors at respective ones of the midpoints of the four dome conductors; and eight capacitors electrically bridging eight respective gaps formed in said eight leg conductors at respective ones of the midpoints of the eight leg conductors.

3. The radiofrequency resonator according to claim 2, wherein said capacitors are 20.5 picofarad capacitors.

4. The radiofrequency resonator according to claim 2, wherein said inner diameter of said hollow cylindrical support structure is sized to permit the support structure to fit over the patient's head.

5. The radiofrequency resonator according to claim 1, wherein said end ring conductor, said eight leg conductors, and said four dome conductors are ½" copper tape.

6. The radiofrequency resonator according to claim 1, wherein said inner diameter is about 27.9 cm and a length of said hollow cylindrical support structure with the dome-shaped end is about 27.9 cm.

7. A radiofrequency resonator for nuclear magnetic resonance imaging and spectroscopy of a patient, comprising:

an end ring conductor with a central axis;

eight substantially equal length leg conductors with respective first ends, second ends, and midpoints, each of the respective first ends being electrically joined to the end ring conductor at positions spaced substantially 45 degrees apart from one another, each of the eight leg conductors being substantially parallel with the central axis and each of the respective second ends of the eight leg conductors terminating on the same side of the end ring conductor; and four dome conductors having respective midpoints and two endpoints, an endpoint of each dome conductor being electrically joined to respective second ends of pairs of leg conductors spaced 135/225 degrees apart from one another, whereby each dome conductor is connected to two of said leg conductors and whereby each leg conductor is connected to one dome conductor;

wherein each midpoint of each dome conductor is a respective predetermined distance from the end ring conductor, said predetermined distances being greater than a distance between the first and second ends of the leg conductors, whereby the dome conductors form a dome shape, each of said four dome conductors intersecting two of said four dome conductors at two intersection points and each of said four dome conductors that intersect each of said two dome conductors being electrically joined to said two intersecting dome conductors at said intersection points.

8. The radiofrequency resonator according to claim 7, further comprising:

four capacitors electrically bridging four respective gaps formed in said four dome conductors at respective ones of the midpoints of the four dome conductors; and eight capacitors electrically bridging eight respective gaps formed in said eight leg conductors at respective ones of the midpoints of the eight leg conductors.

9. The radiofrequency resonator according to claim 8, wherein said capacitors are 20.5 picofarad capacitors.

10. The radiofrequency resonator according to claim 7, wherein a diameter of the end ring conductor is sized to allow the end ring conductor to fit over the patient's head.

11. A radiofrequency resonator for nuclear magnetic resonance imaging and spectroscopy of a patient, comprising:

a hollow cylindrical support structure with an outer surface, an inner diameter, an open end, and a dome-shaped closed end;

an end ring conductor attached to the outer surface of the hollow cylindrical support structure adjacent the open end;

sixteen substantially equal length leg conductors with respective first ends, second ends, and midpoints, each of the respective first ends being electrically joined to the end ring conductor at positions spaced substantially 22.5 degrees apart from one another, each of the sixteen leg conductors being attached to the outer surface of the hollow cylindrical support structure and each respective second end of the sixteen leg conductors terminating adjacent the dome-shaped closed end; and eight dome conductors attached to the outer surface of the dome-shaped closed end, each of the eight dome conductors having respective midpoints and two endpoints, an endpoint of each dome conductor being electrically joined to respective second ends of pairs of leg conductors spaced 112.5/247.5 degrees apart from one another, whereby each dome conductor is connected to two of said leg conductors and whereby each leg conductor is connected to one dome conductor;

wherein each of said eight dome conductors intersects four of said eight dome conductors at four intersection points and wherein each of said eight dome conductors that intersect each of said four dome conductors are electrically joined to said four intersecting dome conductors at said intersection points.

12. The radiofrequency resonator according to claim 11, further comprising:

twenty-four capacitors electrically bridging twenty-four respective gaps formed in said eight dome conductors at midpoints between said intersection points; and sixteen capacitors electrically bridging sixteen respective gaps formed in said sixteen leg conductors at respective ones of the midpoints of the sixteen leg conductors.

13. The radiofrequency resonator according to claim 12, wherein said capacitors are 21.4 picofarad capacitors.

14. The radiofrequency resonator according to claim 12, wherein said inner diameter of said hollow cylindrical support structure is sized to permit the support structure to fit over the patient's head.

15. The radiofrequency resonator according to claim 11, wherein said end ring conductor, said sixteen leg conductors, and said eight dome conductors are ½" copper tape.

16. The radiofrequency resonator according to claim 11, wherein said inner diameter is about 27.9 cm and a length of said hollow cylindrical support structure with the dome-shaped end is about 27.9 cm.

17. A radiofrequency resonator for nuclear magnetic resonance imaging and spectroscopy of a patient, comprising:

an end ring conductor with a central axis;

sixteen substantially equal length leg conductors with respective first ends, second ends, and midpoints, each of the respective first ends being electrically joined to the end ring conductor at positions spaced substantially 22.5 degrees apart from one another, each of the sixteen leg conductors being substantially parallel with the central axis and each of the respective second ends of the sixteen leg conductors terminating on the same side of the end ring conductor; and eight dome conductors having respective midpoints and two endpoints, an endpoint of each dome conductor being electrically joined to respective second ends of pairs of leg conductors spaced 112.5/247.5 degrees apart from one another, whereby each dome conductor is connected to two of said leg conductors and whereby each leg conductor is connected to one dome conductor;

wherein each midpoint of each dome conductor is a respective predetermined distance from the end ring conductor, said predetermined distances being greater than a distance between the first and second ends of the leg conductors, whereby the dome conductors form a dome shape, each of said eight dome conductors intersecting four of said eight dome conductors at four intersection points and each of said eight dome conductors that intersect each of said four dome conductors being electrically joined to said four intersecting dome conductors at said intersection points.

18. The radiofrequency resonator according to claim 17, further comprising:

twenty-four capacitors electrically bridging twenty-four respective gaps formed in said eight dome conductors at midpoints between said intersection points; and sixteen capacitors electrically bridging sixteen respective gaps formed in said sixteen leg conductors at respective ones of the midpoints of the sixteen leg conductors.

19. The radiofrequency resonator according to claim 18, wherein said capacitors are 21.4 picofarad capacitors.

20. The radiofrequency resonator according to claim 17, wherein a diameter of the end ring conductor is sized to allow the end ring conductor to fit over the patient's head.

21. A radiofrequency resonator for nuclear magnetic resonance imaging and spectroscopy of a patient, comprising:

a hollow cylindrical support structure with an outer surface, an inner diameter, an open end, and a dome-shaped closed end;

an end ring conductor attached to the outer surface of the hollow cylindrical support structure adjacent the open end;

n*2 substantially equal length leg conductors with respective first ends, second ends, and midpoints, each of the respective first ends being electrically joined to the end ring conductor at positions spaced substantially 360/(n*2) degrees apart from one another, each of the n*2 leg conductors being attached to the outer surface of the hollow cylindrical support structure and each respective second end of the n*2 leg conductors terminating adjacent the dome-shaped closed end; and n dome conductors attached to the outer surface of the dome-shaped closed end, each of the n dome conductors having respective midpoints and two endpoints, an endpoint of each dome conductor being electrically joined to respective second ends of pairs of leg conductors spaced (360/(n*2))*((n/2)+1) degrees apart from one another in one circumferential direction and (360) −[(360/(n*2))*((n/2)+1)] degrees apart from one another in another circumferential direction, whereby each dome conductor is connected to two of said leg conductors and whereby each leg conductor is connected to one dome conductor;

wherein each of said n dome conductors intersects n/2 of said n dome conductors at n/2 intersection points and wherein each of said n dome conductors that intersect each of said n/2 dome conductors are electrically joined to said n/2 intersecting dome conductors at said intersection points, and wherein n is an integer greater than 3.

* * * * *